United States Patent
Hachisuka et al.

(10) Patent No.: US 6,309,931 B1
(45) Date of Patent: Oct. 30, 2001

(54) METHOD OF MAKING A SEMICONDUCTOR DEVICE WITH SIDEWALL INSULATING LAYERS IN THE CAPACITOR CONTACT HOLE

(75) Inventors: Atsushi Hachisuka; Takeshi Noguchi, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/688,708

(22) Filed: Oct. 17, 2000

Related U.S. Application Data

(62) Division of application No. 08/687,934, filed on Jul. 29, 1996, now Pat. No. 6,160,284.

(30) Foreign Application Priority Data

Nov. 9, 1995 (JP) .................................................... 7-291386
May 21, 1996 (JP) .................................................... 8-125616

(51) Int. Cl.[7] ............................................... H01L 21/8236
(52) U.S. Cl. ........................ 438/278; 438/253; 438/396; 257/306
(58) Field of Search .................................. 438/278, 253, 438/396; 257/306

(56) References Cited

U.S. PATENT DOCUMENTS

| | | | |
|---|---|---|---|
| 5,235,199 | 8/1993 | Hamamoto et al. | 257/306 |
| 5,352,621 | * 10/1994 | Kim et al. | 438/253 |
| 5,389,566 | 2/1995 | Lage | 438/3 |
| 5,399,518 | 3/1995 | Sim et al. | 438/396 |
| 5,441,909 | 8/1995 | Kim | 438/397 |
| 5,459,688 | 10/1995 | Pfiester et al. | 257/69 |
| 5,504,041 | 4/1996 | Summerfelt | 438/396 |
| 5,565,372 | 10/1996 | Kim | 438/253 |
| 5,580,811 | 12/1996 | Kim | 438/253 |
| 5,777,358 | 7/1998 | Yajima | 257/306 |

FOREIGN PATENT DOCUMENTS

| | | |
|---|---|---|
| 1-243573 | 9/1989 | (JP) . |
| 5-75060 | 3/1993 | (JP) . |
| 6-291273 | 10/1994 | (JP) . |
| 7-7086 | 1/1995 | (JP) . |

* cited by examiner

*Primary Examiner*—Richard Elms
*Assistant Examiner*—Christian D. Wilson
(74) *Attorney, Agent, or Firm*—McDermott, Will & Emery

(57) ABSTRACT

Source/drain regions of an MOS transistor are formed at a surface of a p-type silicon substrate. A storage node electrically connected to the source/drain regions penetrates a bit line to reach the n-type source/drain region. The storage node and the bit line are insulated from each other by a sidewall insulating layer. Thus, a semiconductor memory device suitable for high integration is obtained in which short-circuit between the storage node and the bit line on a gate electrode layer can be prevented.

6 Claims, 32 Drawing Sheets

METHOD OF MAKING A SEMICONDUCTOR DEVICE WITH SIDEWALL INSULATING LAYERS IN THE CAPACITOR CONTACT HOLE

This application is a Divisional of application Ser. No. 08/687,934 filed Jul. 29, 1996 now U.S. Pat. No. 6,160,284.

BACKGROUND OF THE INVENTION

1. Field of the Invention

The present invention relates to a semiconductor memory device and a method of manufacturing the same. It particularly relates to a memory cell structure of a DRAM (Dynamic Random Access Memory) and a method of manufacturing the same.

2. Description of the Background Art

In a DRAM, application of a buried bit line type of memory cells, where a bit line is positioned in a layer below a storage node (a lower electrode) of a capacitor, decreases limitations on the planar layout of the storage node. Accordingly, the buried bit line type of memory cells advantageously allow a large storage node capacity.

In this case, however, the bit line and a gate electrode layer of a transfer gate transistor exist in the layer below the storage node. Therefore, a contact hole for electrically connecting the storage node to the source/drain regions of the transfer gate transistor must be arranged avoiding the bit line or the like. Such an arrangement of the storage node contact will complicate the shape of a field active region and increase the size of a memory cell.

A technique for preventing the increase in size of the memory cell is disclosed, for example, in Japanese Patent Laying-Open No. 1-243573. The structure disclosed therein will now be described as a conventional semiconductor memory device.

FIG. 46 is a partial plan view schematically illustrating the structure of the conventional semiconductor memory device. FIGS. 47 and 48 are schematic cross sectional views taken along the lines XLVII—XLVII and XLVIII—XLVIII of FIG. 46, respectively.

Referring to FIGS. 46–48, the memory cells for this DRAM have one transistor—one capacitor structure.

An element-isolating insulating film 3a is formed on a surface of p-type silicon substrate 1 to define an active region 2. A p$^+$ channel stopper region 3b is formed on the lower side of element-isolating insulating film 3a.

An MOS (Metal Oxide Semiconductor) transistor 10 serving as a transfer gate transistor is formed at active region 2. MOS transistor 10 has a pair of n-type source/drain regions 5, 5, a gate insulating layer 7 and a gate electrode layer 9. The paired n-type source/drain regions 5, 5 are formed on a surface of p-type silicon substrate 1 such that they are spaced apart from each other by a predetermined distance. Gate electrode layer 9 is formed on a region between the paired source/drain regions 5, 5 with gate insulating layer 7 interposed.

An interlayer insulating film 11 is formed to cover MOS transistor 10. Formed in interlayer insulating film 11 is a contact hole 13 reaching one of the paired source/drain regions 5. A bit line 15 is formed such that it electrically connects to n-type source/drain regions 5 through contact hole 13 and extends on interlayer insulating layer 11.

An interlayer insulating layer 17 is formed to cover bit line 15. A contact hole 19 reaching the other of the paired source/drain regions 5 is formed in interlayer insulating layer 11, 17. A capacitor 30 is formed on interlayer insulating layer 17 to be electrically connected to the other of source/drain regions 5 through contact hole 19.

Capacitor 30 has a storage node 23, a capacitor insulating layer 25 and a cell plate (an upper electrode) 27. Storage node 23 is electrically connected to source/drain region 5 through contact hole 19 and extends on interlayer insulating layer 17. Cell plate 27 is opposed to that portion of storage node 23 which extends over interlayer insulating layer 17, with capacitor insulating layer 25 posed therebetween.

Especially, this memory cell structure is characterized in that storage node 23 penetrates bit line 15 to electrically connect with source/drain region 5 of MOS transistor 10. That is, bit line 15 is provided with a through hole 15a, and contact hole 19 for a storage node contact passes through thorough hole 15a.

Since the conventional semiconductor memory device has the above structure, it may be manufactured by the following method.

FIGS. 49–52 are schematic cross sectional views illustrating the steps of manufacturing the conventional semiconductor memory device. Referring first to FIG. 49, element-isolating insulating film 3a and p$^+$ channel stopper region 3b thereunder are formed to define an active region on a surface of p-type silicon substrate 1. Gate electrode layer 9 having a predetermined shape is formed on p-type silicon substrate 1 with gate insulating layer 7 posed therebetween. The paired n-type source/drain regions 5, 5 are formed such that that region on p-type silicon substrate 1 which is positioned below gate electrode layer 9 is sandwiched between source/drain regions 5, 5. Thus, MOS transistor 10 is provided that is formed of the paired n-type source/drain regions 5, 5, gate insulating layer 7 and gate electrode layer 9.

Interlayer insulating layer 11 is formed to cover MOS transistor 10. Contact hole 13 is formed in interlayer insulating layer 11 by typical photolithography and etching techniques. Bit line 15 is formed such that it electrically connects with one of the paired n-type source/drain regions 5 and extends on interlayer insulating layer 11. Through hole 15a is formed in bit line 15 by the typical photolithography and etching techniques.

Referring to FIG. 50, interlayer insulating layer 17 is formed on interlayer insulating layer 11 to fill through hole 15a and to cover bit line 15.

Referring to FIG. 51, a resist pattern 141a is formed on interlayer insulating layer 17 by the typical photolithography technique. Resist pattern 141a is used as a mask and anisotropic etching is performed. Thus, contact hole 19 is formed that passes through hole 15a in bit line 15 to reach the other of n-type source/drain regions 5. Then, resist pattern 141a is removed.

Referring to FIG. 52, storage node 23 of the capacitor is formed such that it electrically connects with n-type source/drain region 5 through contact hole 19 and extends on interlayer insulating layer 17.

Then capacitor insulating film 25 and cell plate 27 are formed and the conventional semiconductor memory device shown in FIGS. 46–48 is completed.

In the conventional semiconductor memory device, it is not necessary to provide a storage node contact avoiding bit line 15, since contact hole 19 penetrates bit line 15, as shown in FIGS. 46–48. Therefore, increase in the size of a memory cell due to the necessity of avoiding bit line 15 can be prevented. In this respect, the structure of the conventional semiconductor memory device is advantageous to high integration.

For the conventional semiconductor memory device, however, after the formation of through hole 15a in bit line 15, contact hole 19 is formed to pass through hole 15a. This causes short-circuit between storage node 23 and bit line 15 or gate electrode layer 9 due to misregistration of a mask. This problem will now be described in detail.

The center (represented by the chained line T—T) of a hole pattern 143a of resist pattern 141a shown in FIG. 51 might be displaced to the right or left due to the misregistration of the mask.

FIG. 53 is a cross sectional view illustrating hole pattern 143a displaced to the right in the figure due to misregistration of the mask of resist pattern 141a in FIG. 51. Referring to FIG. 53, if resist pattern 141a is used as a mask and the underlying layers are etched with hole pattern 143a displaced, bit line 15 might undesirably be exposed at the side wall of contact hole 19. If storage node 23 of the capacitor is formed with bit line 15 exposed at contact hole 19, storage node 23 and bit line 15 will short-circuited, as shown in FIG. 54.

Furthermore, if hole pattern 143a is displaced due to the mask misregistration, gate electrode layer 9 can be exposed at the sidewall of contact hole 19, as shown in FIG. 55. In this case, storage node 23 which will be formed in a subsequent step and gate electrode layer 9 will be short-circuited.

SUMMARY OF THE INVENTION

An object of the present invention is to provide a semiconductor memory device suitable for high integration in which short circuit between a storage node and a bit line or a gate electrode layer can be prevented, and a method of manufacturing the same.

A semiconductor memory device according to the present invention is provided with a semiconductor substrate, a gate electrode layer, a pair of source/drain regions, a first insulating layer, a conductive layer for a bit line, a second insulating layer, a sidewall insulating layer and a conductive layer for a storage node of a capacitor. The semiconductor substrate has a main surface. The gate electrode layer is formed on the main surface of the semiconductor substrate with a gate insulating layer posed therebetween. The paired source/drain regions are formed on the main surface of the semiconductor substrate such that a region of the semiconductor substrate below the gate electrode layer is positioned between the source/drain regions. The first insulating layer is formed on the main surface of the semiconductor substrate to cover the gate electrode layer and has a first hole reaching one of the paired source/drain regions. The conductive layer for the bit line is formed to extend on the first insulating layer and is electrically connected to one of the paired source/drain regions through the first hole. The second insulating layer is formed to cover the conductive layer for the bit line. In the first insulating layer, the conductive layer for the bit line and the second insulating layer, a second hole is formed to penetrate the first insulating layer, the conductive layer for the bit line and the second insulating layer to reach the other of the paired source/drain regions. The sidewall insulating layer is formed on a sidewall of the second hole such that the sidewall insulating layer covers at least that surface of the conductive layer for the bit line which is exposed at the second hole. The conductive layer for the storage node of the capacitor is electrically connected to the other of the paired source/drain regions through the second hole.

In the semiconductor memory device according to the present invention, the second hole for the storage node contact penetrates the conductive layer for the bit line. Therefore, it is not necessary for the storage node contact to be arranged avoiding the bit line. Thus, increase in the size of a memory cell due to the arrangement in which the storage node avoids the bit line can be prevented.

Furthermore, the sidewall insulating layer is formed on the sidewall of the second hole penetrating the conductive layer for the bit line. Therefore, when the storage node is formed within the second hole, the sidewall insulating layer prevents short-circuit between the storage node and the bit line.

A method of manufacturing a semiconductor memory device according to one aspect of the present invention includes the following steps.

First, a gate electrode layer is formed on a main surface of a semiconductor substrate with a gate insulating layer posed therebetween. Then, a pair of source/drain regions are formed on the main surface of the semiconductor substrate such that a region of the semiconductor substrate below the gate electrode layer is positioned between the paired source/drain regions. Then, a first insulating layer is formed on the main surface of the semiconductor substrate to cover the gate electrode layer. Then, a first hole is formed in the first insulating layer to reach one of the paired source/drain regions. Then, a conductive layer for a bit line is formed such that it electrically connects with one of the paired source/drain regions through the first hole and extends on the first insulating layer. Then, a second insulating layer is formed on the first insulating layer to cover the conductive layer for the bit line. Then, a resist pattern having a predetermined shape is formed on the second insulating layer. By using the resist pattern as a mask, the second insulating layer, the conductive layer for the bit line and the first insulating layer are etched to form a second hole which penetrates the conductive layer for the bit line to reach the other of the paired source/drain regions. Then, a sidewall insulating layer is formed to cover the sidewall of the second hole. Then, a conductive layer for a storage node of a capacitor is formed that electrically connects with the other of the paired source/drain regions through the second hole.

According to one aspect of the method of manufacturing a semiconductor memory device of the present invention, a through hole through which the storage node penetrates is formed in the conductive layer for the bit line simultaneously with the formation of the second hole serving as a storage node contact. This causes the conductive layer for the bit line to be exposed at the sidewall of the second hole. However, the exposed portion is covered with the sidewall insulating layer. Therefore, short-circuit between the conductive layer for the bit line and the storage node is prevented.

Furthermore, since a through hole through which the storage node penetrates is formed in the conductive layer for the bit line simultaneously with the formation of the second hole serving as a storage node contact, the film thickness of the sidewall insulating layer covering the conductive layer for the bit line will not be extremely reduced locally, if there is a misregistration of a mask at the resist pattern in forming the second hole. Accordingly, decreased breakdown voltage between the storage node and the bit line as well as short circuit between the storage node and the bit line, due to an extremely reduced thickness of the sidewall insulating layer, are prevented.

Furthermore, a through hole through which the storage node penetrates is formed in the conductive layer for the bit line simultaneously with the formation of the second hole serving as a storage node contact. Therefore, increased contact resistance due to reduced area of a contact portion of the storage node and the source/drain regions and due to the contact portion scraped off by etching is prevented, even if there is a misregistration of a mask at the resist pattern in forming the second hole.

In the above aspect, the steps of forming the sidewall insulating layer preferably includes the step of forming a third insulating layer covering the internal wall of the second hole and the second insulating layer, and the step of anisotropically etching the third insulating layer until the main surface of the semiconductor substrate is exposed at the bottom wall of the second hole.

Thus, the sidewall insulating layer is formed by self-alignment. Therefore, increase in size of a memory cell can further be restrained.

A method of manufacturing a semiconductor memory device according to another aspect of the present invention includes the following steps.

First, a gate electrode layer is formed on a main surface of a semiconductor substrate with a gate insulating layer posed therebetween. Then, a pair of source/drain regions are formed on the main surface of the semiconductor substrate such that a region of the semiconductor substrate below the gate electrode layer is positioned between the paired source/drain regions. Then, a first insulating layer is formed on the main surface of the semiconductor substrate to cover the gate electrode layer. Then, a first hole is formed in the first insulating layer to reach one of the paired source/drain regions. Then, a conductive layer for a bit line is formed such that it electrically connects with one of the paired source/drain regions through the first hole and extends on the first insulating layer. Then, a second insulating layer is formed on the first insulating layer to cover the conductive layer for the bit line. Then, a second hole penetrating the second insulating layer and the conductive layer for the bit line to expose a surface of the first insulating layer is formed at a region directly above the other of the paired source/drain regions. Then, a third insulating layer is formed to cover a surface of the internal wall of the second hole and a surface of the second insulating layer. Then, the third insulating layer is etched until the first insulating layer is exposed at a bottom surface of the second hole and the first insulating layer exposed at the bottom surface of the second hole is also etched to form a sidewall insulating layer formed of the third insulating layer covering an exposed surface of the conductive layer and the bit line, thus forming a contact hole reaching the other of the paired source/drain regions. Then, a conductive layer for a storage node for a capacitor is formed which electrically connects with the other of the paired source/drain regions via the contact hole.

A method of manufacturing semiconductor memory devices according to still another aspect of the present invention includes the following steps.

First, a gate electrode layer is formed on a main surface of a semiconductor substrate with a gate insulating layer posed therebetween. Then, a pair of source/drain regions are formed on the main surface of the semiconductor substrate such that a region of the semiconductor substrate below the gate electrode layer is positioned between the paired source/drain regions. Then, a first insulating layer is formed on the main surface of the semiconductor substrate to cover the gate electrode layer. Then, a first hole is formed in the first insulating layer to reach one of the paired source/drain regions. Then, a conductive layer for a bit line is formed such that it electrically connects with one of the paired source/drain regions through the first hole and extends on the first insulating layer. Then, a second insulating layer is formed on the first insulating layer to cover the conductive layer for the bit line. Then, a second hole penetrating the second insulating layer and reaching a surface of the conductive layer for the bit line is formed at a region directly above the other of the paired source/drain regions. Then, a third insulating layer is formed to cover a surface of the internal wall of the second hole and a surface of the second insulating layer. Then, the third insulating layer is etched until a surface of the conductive layer for the bit line is exposed at a bottom surface of the second hole to form a first sidewall insulating layer formed of the third insulating layer at a sidewall of the second hole. Then, the conductive layer for the bit line exposed at the bottom surface of the second hole is etched until a surface of the first insulating layer is exposed. Then the first insulating layer exposed at a bottom surface of the second hole is etched to form a hole reaching a surface of the other of the paired source/drain regions. Then, a fourth insulating layer is formed to cover a surface of the internal wall of the hole reaching the surface of the other of the paired source/drain regions and a surface of the second insulating layer. Then, the fourth insulating layer is etched until a surface of the other of the paired source/drain regions is exposed to form a second sidewall insulating layer formed of the fourth insulating layer and covering the exposed surface of the conductive layer for the bit line, thus forming a contact hole reaching the surface of the other of the paired source/drain regions. Then, a conductive layer for a storage node for a capacitor is formed which electrically connects with the other of the paired source/drain regions via the contact hole.

A method of manufacturing semiconductor memory devices according to still another aspect of the present invention includes the following steps.

First, a gate electrode layer is formed on a main surface of a semiconductor substrate with a gate insulating layer posed therebetween. Then, a pair of source/drain regions are formed on the main surface of the semiconductor substrate such that a region of the semiconductor substrate below the gate electrode layer is positioned between the paired source/drain regions. Then, a first insulating layer is formed on the main surface of the semiconductor substrate to cover the gate electrode layer. Then, a first hole is formed in the first insulating layer to reach one of the paired source/drain regions. Then, a conductive layer for a bit line is formed such that it electrically connects with one of the paired source/drain regions through the first hole and extends on the first insulating layer. Then, a second insulating layer is formed on the first insulating layer to cover the conductive layer for the bit line. Then, a second hole penetrating the second insulating layer and reaching a surface of the conductive layer for a bit line is formed at a region directly above the other of the paired source/drain regions. Then, a third insulating layer is formed to cover a surface of the internal wall of the second hole and a surface of the second insulating layer. Then, the third insulating layer is etched until a surface of the conductive layer for the bit line is exposed at a bottom surface of the second hole to form a first sidewall insulating layer formed of the third insulating layer at a sidewall of the second hole. Then, the conductive layer for the bit line is exposed at the bottom surface of the second hole is etched until a surface of the first insulating layer is exposed. Then, a fourth insulating layer is formed to cover the exposed surface of the first insulating layer, an exposed side surface of the conductive layer for the bit line, and a surface of the second insulating layer. Then, the fourth insulating layer is anisotropically etched until the first insulating layer is exposed, and the exposed first insulating layer is also anisotropically etched until the other of the paired source/drain regions is reached to form a second sidewall insulating layer formed of the fourth insulating layer to cover the side surface of the conductive layer for the bit line, thus forming a contact hole reaching the other of the paired source/drain regions. Then, a conductive layer for a storage node for a capacitor is formed which electrically connects with the other of the paired source/drain regions via the contact hole.

In the method of manufacturing semiconductor memory devices according to the above three aspects of the present invention, not a hole penetrating a conductive layer for a bit line and reaching source/drain regions is formed by continuously etching layers, but an insulating layer is formed when the hole is halfway formed. Thus, an insulating layer on the conductive layer for the bit line is not lost when the hole reaching the source/drain regions is formed. This prevents short circuit between a storage node formed above the conductive line for the bit line and the conductive layer for the bit line.

Furthermore, even if the contact hole is displaced from a predetermined position due to mask misregistration in photolithography, short circuit between a storage node and a semiconductor substrate is not caused.

Furthermore, crystal defect caused at a region of the source/drain regions directly under the contact hole is restrained. Thus, increase in leakage current resulting from the crystal defect is also prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 16 and 19 are the first and second steps illustrating a first problem of a method of manufacturing a semiconductor memory device according to the first embodiment of the present invention, respectively.

DESCRIPTION OF THE PREFERRED EMBODIMENT

Embodiments of the present invention will now be described with reference to the figures.

[First Embodiment]

Figure 2:
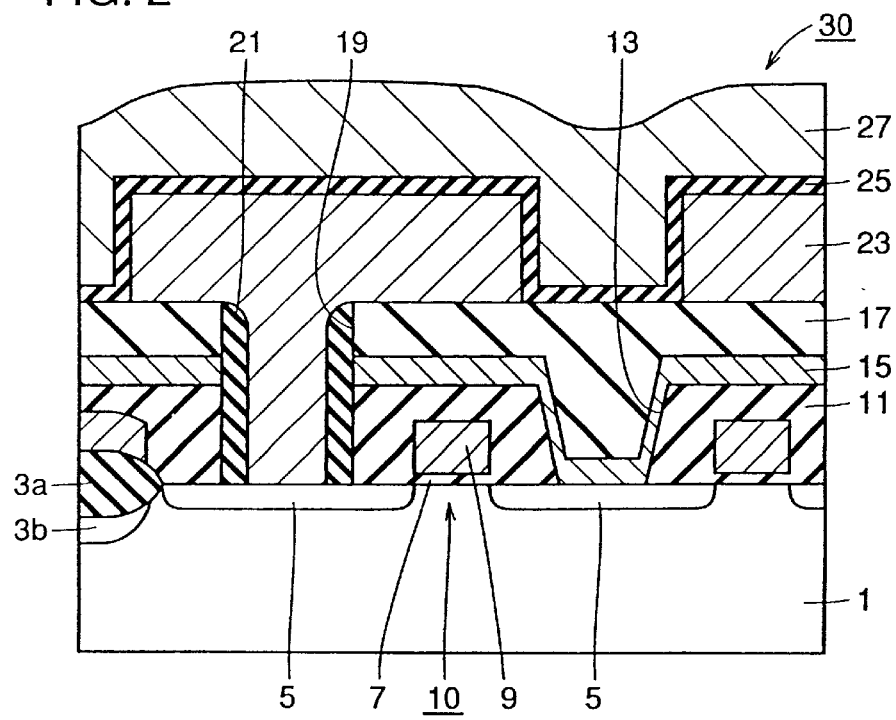
FIG. 2 is a schematic cross sectional view taken along the line II—II of FIG. 1.

Referring mainly to FIG. 2, an element-isolating insulating film 3a formed, for example, of a silicon oxide film is formed on a surface of a p-type silicon substrate 1 to define an active region 2. Formed at a lower side of element-isolating insulating film 3a is a channel stopper region 3b. An MOS transistor 10 serving as a transfer gate transistor of a DRAM is formed at active region 2.

MOS transistor 10 has a pair of source/drain regions 5, 5, a gate insulating layer 7 and a gate electrode layer 9. The paired n-type, source/drain regions 5, 5 are formed at a surface of p-type silicon substrate 1, spaced apart from each other by a predetermined distance. Gate electrode layer 9 is formed on a region between the paired n-type source/drain regions 5, 5 with a gate insulating layer 7 posed therebetween. Gate electrode layer 9 is formed of polycrystalline silicon doped with an impurity such as phosphorus (referred to as "doped polysilicon" hereinafter).

An interlayer insulating layer 11 formed, for example, of a silicon oxide film is formed to cover MOS transistor 10. Formed in interlayer insulating layer 11 is a contact hole 13 reaching one of the paired n-type source/drain regions 5, 5. A bit line 15 is formed such that it electrically connects with n-type source/drain region 5 through contact hole 13 and extends on internal layer insulating layer 11.

An interlayer insulating layer 17 formed, for example, of a silicon oxide film is formed above interlayer insulating layer 11 to cover bit line 15. Formed in interlayer insulating layers 17, 11 and bit line 15 is a contact hole 19 penetrating layers 11, 15, 17 to reach the other of the paired n-type source/drain regions 5, 5. Bit line 15 appears at a sidewall of contact hole 19. That is, a sidewall of bit line 15 forms a portion of the sidewall of contact hole 19.

A sidewall insulating layer 21 is formed on the sidewall of contact hole 19 to cover at least the surface of bit line 15. Sidewall insulating layer 21 is formed, for example, of a silicon oxide film or silicon nitride film. A capacitor 30 is formed on interlayer insulating layer 17 to be electrically connected to n-type source/drain region 5 through contact hole 19.

Capacitor 30 has a storage node 23, a capacitor insulating layer 25 and a cell plate 27. Storage node 23 electrically connects with n-type source/drain region 5 through contact hole 19 and has a portion extending on interlayer insulating layer 17. Storage node 23 is formed of polysilicon doped with an impurity such as phosphorus. Capacitor insulating layer 25 is formed to cover storage node 23. Capacitor insulating layer 25 is formed of a multi-layered film including a silicon oxide film and a silicon nitride film. Cell plate 27 is formed facing storage node 23 with capacitor insulating layer 25 posed therebetween. Cell plate 27 is formed of polysilicon doped, for example, with phosphorus.

Figure 1:
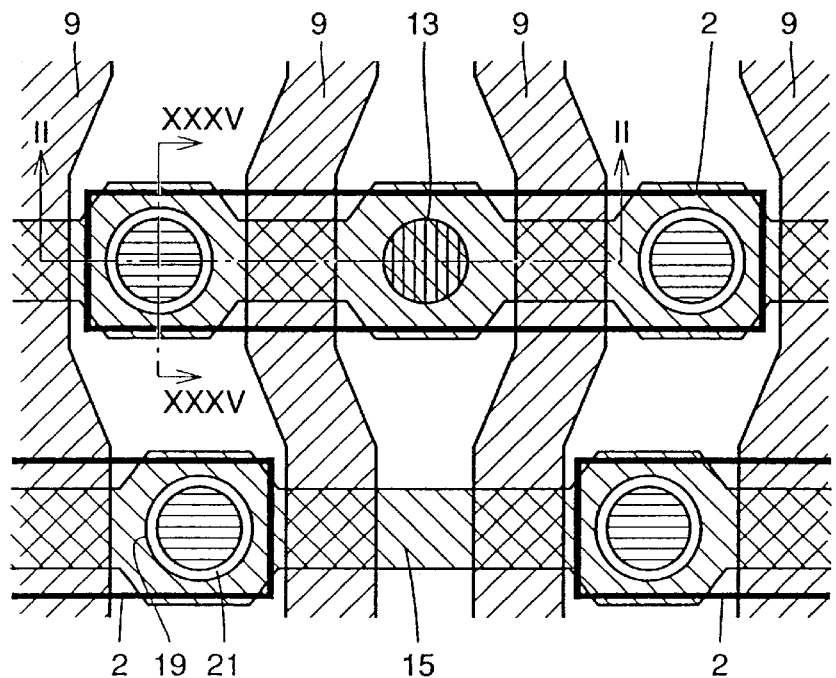
FIG. 1 is a partial plan view schematically illustrating the structure of a semiconductor memory device according to a first embodiment of the present invention.

Referring mainly to FIG. 1, gate electrode layers 9, one for each MOS transistor 10, are integrated to serve as a word line 9. Word line 9 and bit line 15 are disposed orthogonally and to form a matrix. MOS transistor is provided near the crossing portion of word line 9 and bit line 15.

Figure 3:
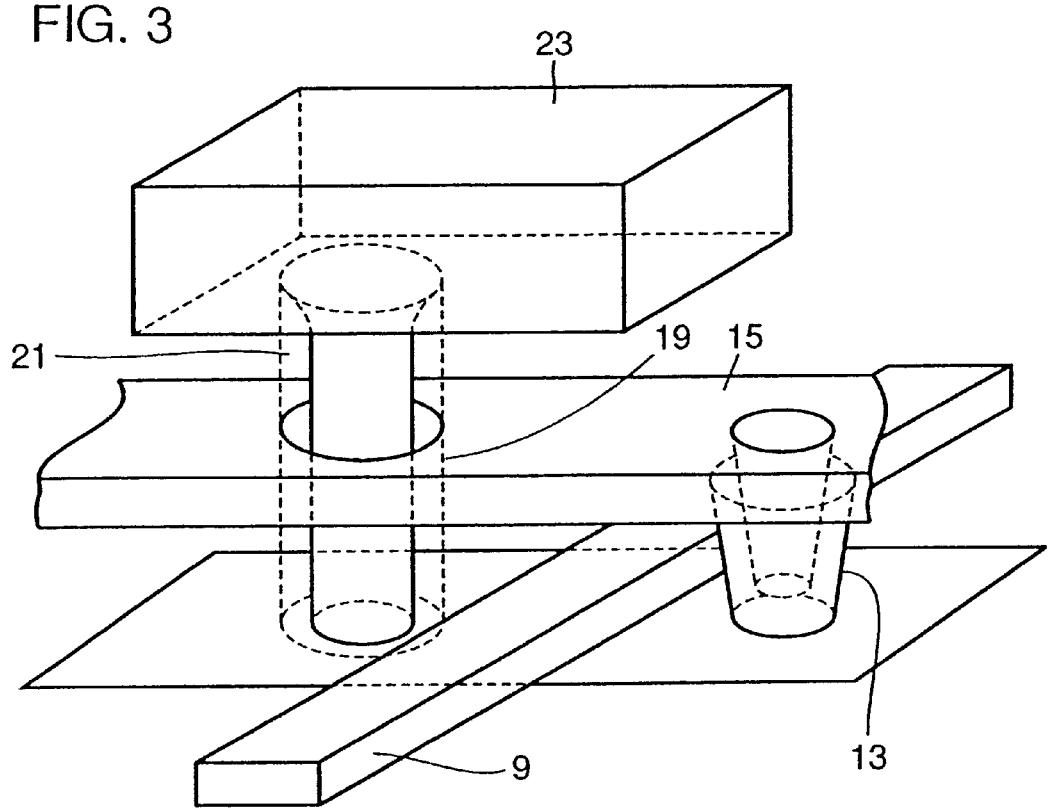
FIG. 3 is a schematic perspective view illustrating the positional relation of the gate electrode layer, the bit line and the storage node in a semiconductor memory device according to the first embodiment of the present invention.

Referring mainly to FIG. 3, the structure of the present embodiment is characterized in that contact hole 19 penetrates bit line 15, bit line 15 appears at the sidewall of contact hole 19 and that the sidewall of contact hole 19 is covered with sidewall insulating layer 21.

A method of manufacturing a semiconductor memory device of the present embodiment will now be described.

Figure 4:
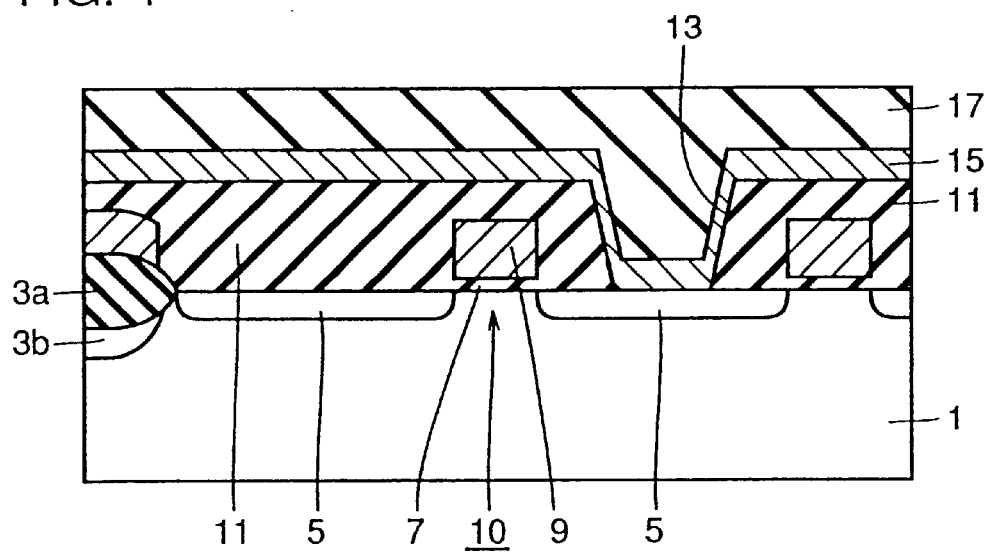
FIGS. 4–10 are schematic cross sectional views illustrating, in order, the steps of a method of manufacturing a semiconductor memory device according to the first embodiment of the present invention.

Referring first to FIG. 4, element-isolating insulating film 3a and channel stopper region 3b positioned thereunder are simultaneously formed on a surface of p-type silicon substrate 1 by the typical LOCOS (Local Oxidation of Silicon) method to define an active region.

Gate electrode layer 9 of polysilicon doped, for example, with phosphorus is formed on p-type silicon substrate 1 with gate insulating layer 7 posed therebetween. The paired n-type source/drain regions 5, 5 are formed on both sides of a region of p-type silicon substrate 1 positioned below gate electrode layer 9, for example, by using gate electrode layer 9 and element-isolating insulating film 3a as masks and ion-implanting an n-type impurity. The paired n-type source/drain regions 5, 5, gate insulating layer 7 and gate electrode layer 9 form MOS transistor 10.

Interlayer insulating layer 11 formed, for example, of a silicon oxide film is formed to cover MOS transistor 10. Contact hole 13 reaching one of the paired of n-type source/drain regions 5 is formed in interlayer insulating layer 11 by typical photolithography and etching techniques. Polysilicon layer 15 doped with an impurity such as phosphorus is formed on interlayer insulating layer 11 to be electrically connected to n-type source/drain region 5 through contact hole 13. Doped polysilicon film 15 is patterned by typical photolithography and etching techniques to bit line 15. Interlayer insulating layer 17 formed, for example, of a silicon oxide film is formed above interlayer insulating layer 11 to cover bit line 15.

Figure 5:
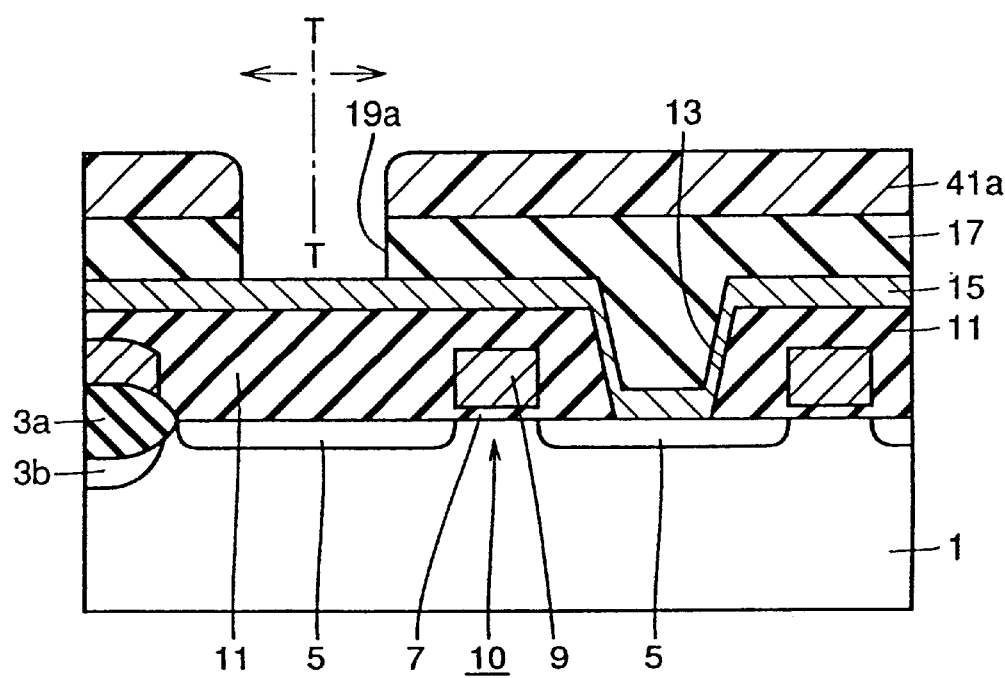

Referring to FIG. 5, a resist pattern 41a is formed on interlayer insulating layer 17 by a typical photolithography technique. Resist pattern 41a is used as a mask, and interlayer insulating layer 17 is anisotropically etched until a surface of bit line 15 is exposed. Thus, an opening 19a is formed in interlayer insulating layer 17.

Figure 6:
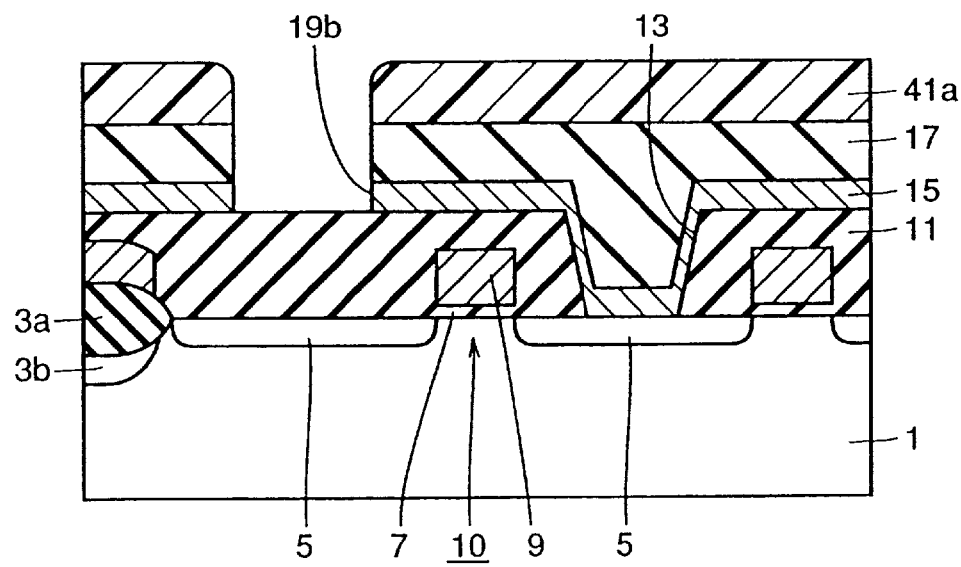

Referring to FIG. 6, resist pattern 41a is still used as a mask and bit line 15 is anisotropically etched until a surface of interlayer insulating layer 11 is exposed. Thus, a through hole 19b is formed in bit line 15.

Figure 7:
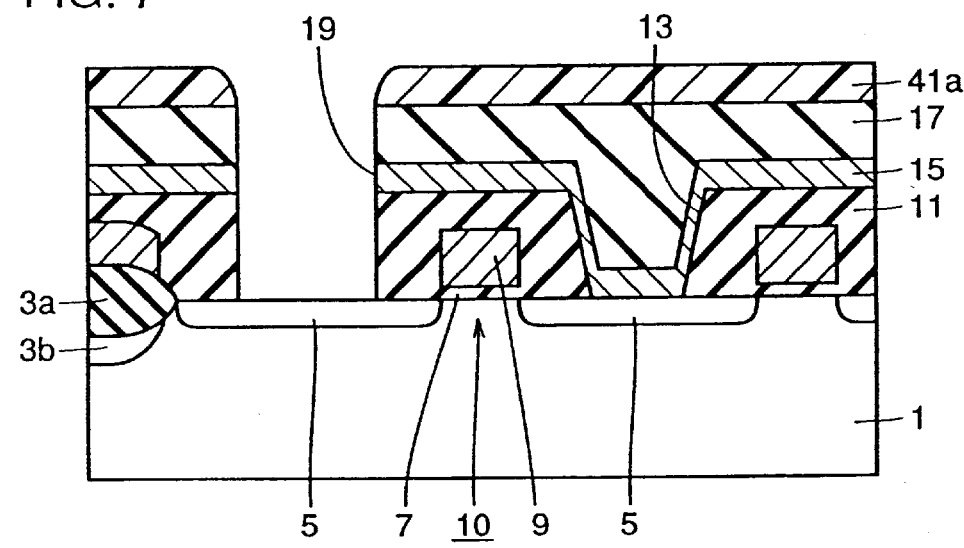

Referring to FIG. 7, resist pattern 41a is still used as a mask and interlayer insulating layer 11 is anisotropically etched until a surface of p-type silicon substrate 1 is exposed. Thus, contact hole 19 reaching n-type source/drain region 5 is formed. Then, resist pattern 41a is removed.

Interlayer insulating layer 17, bit line 15 and interlayer insulating layer 11 shown in FIGS. 5–7 may be etched sequentially. That is, interlayer insulating layer 17, bit line 15 and interlayer insulating layer 11 may be etched in the same etching apparatus only by changing conditions such as the etching gas.

In order to obtain a stable shape after the processing, however, ideally, interlayer insulating layer 17, bit line 15 and interlayer insulating layer 11 are each etched in a different, dedicated etching apparatus and in a separate processing step.

Figure 8:
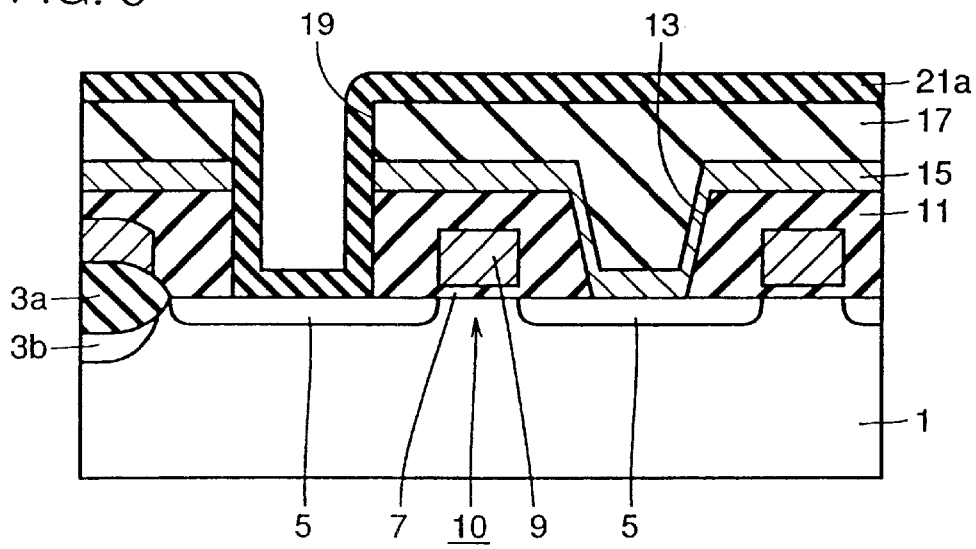

Referring to FIG. 8, an insulating layer 21a formed, for example, of a silicon oxide film or silicon nitride film is formed on an internal wall of contact hole 19 and on the entire surface of interlayer insulating layer 17. The entire surface of insulating layer 21a is etched back until a surface of p-type silicon substrate 1 is exposed at the bottom wall of contact hole 19.

Figure 9:
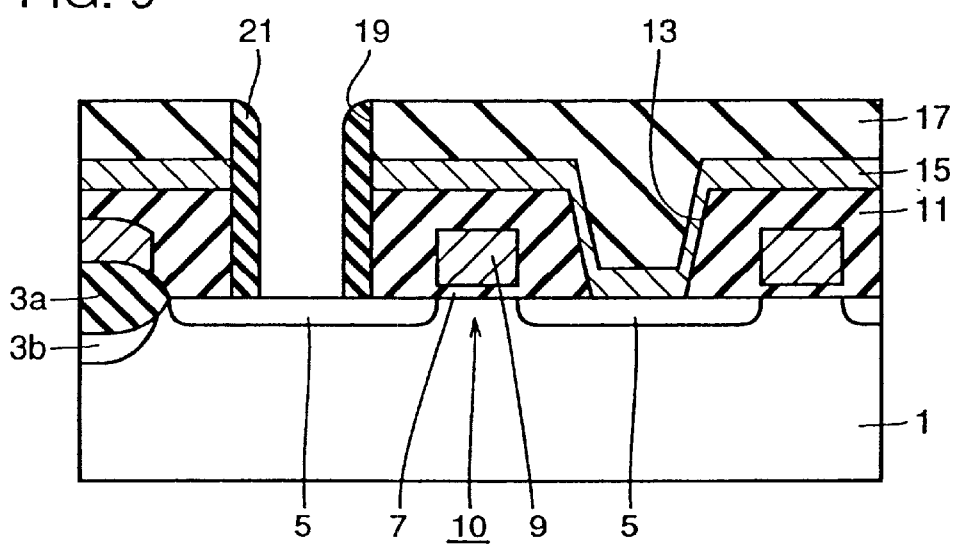

Referring to FIG. 9, by the etching-back, sidewall insulating layer 21 is formed that covers a sidewall of contact hole 19 to cover at least a portion of bit line 15 facing contact hole 19.

Figure 10:
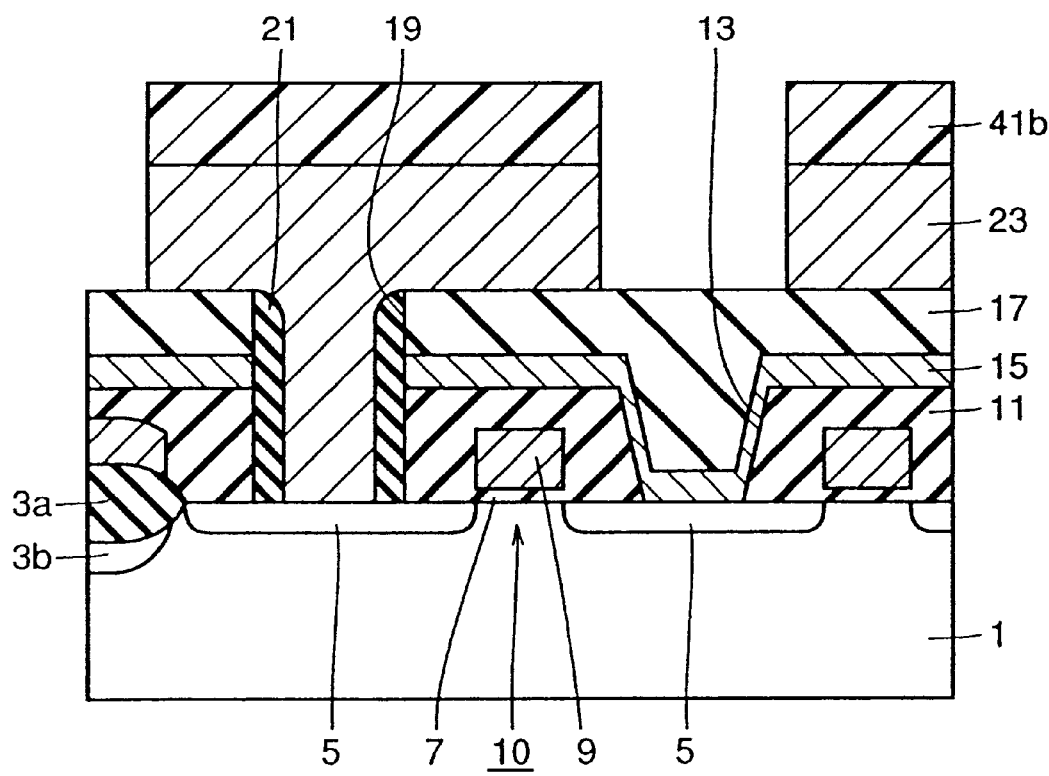

Referring to FIG. 10, a polysilicon film 23 doped with impurity such as phosphorus is formed on the entire surface of interlayer insulating layer 17 such that doped polysilicon film 23 fills contact hole 19. A resist pattern 41b is formed on doped polysilicon film 23 by a typical photolithography technique. Resist pattern 41b is used as a mask and doped polysilicon film 23 is anisotropically etched. Thus, storage node 23 is formed that is electrically connected to n-type source/drain region 5 through contact hole 19 and has a portion extending on interlayer insulating layer 17. Then, resist pattern 41b is removed.

Capacitor insulating layer 25 having a stacked structure formed, for example, of a silicon oxide film and a silicon nitride film is formed to cover storage node 23. Furthermore, cell plate 27 formed of a polysilicon film doped with impurity such as phosphorus is formed such that it is opposed to storage node 23 with capacitor insulating layer 25 posed therebetween, and a semiconductor memory device of the present embodiment shown in FIG. 2 is thus completed.

In a semiconductor memory device of the present embodiment, contact hole 19 for a storage node contact is provided such that it penetrates bit line 15, as shown in FIG. 2. Accordingly, it is not necessary to arrange contact hole 19 avoiding bit line 15. Therefore, it is not necessary to increase the size of a memory cell to avoid storage node 23 contacting bit line 15. Furthermore, sidewall insulating layer 21 can be formed by self-alignment, which also avoids increasing the size of a memory cell.

More specifically, as compared with the arrangement in which storage node 23 avoids bit line 15, it becomes possible to reduce 20–30% of the area of a memory cell with the same design rule.

Furthermore, in the process steps shown in FIGS. 5–7, through hole 19b through which the storage node penetrates is formed in bit line 15 simultaneously with the formation of contact hole 19. Although this causes bit line 15 to be exposed at a sidewall of contact hole 19, the exposed portion of bit line 15 is covered with sidewall insulating layer 21 formed in the process shown in FIGS. 8 and 9. Accordingly, short-circuit between bit line 15 and storage node 23 formed in the process shown in FIG. 10 is prevented.

Furthermore, in the method of manufacturing a semiconductor memory device of the present embodiment, through hole 19b is formed in bit line 15 simultaneously with the formation of contact hole 19, as shown in FIG. 6. Accordingly, the method has the following advantage as compared with the conventional manufacturing method shown in FIGS. 49–52 to which the method of forming a sidewall insulating layer disclosed in Japanese Patent Laying-Open No. 5-75060 is applied.

Figure 51:
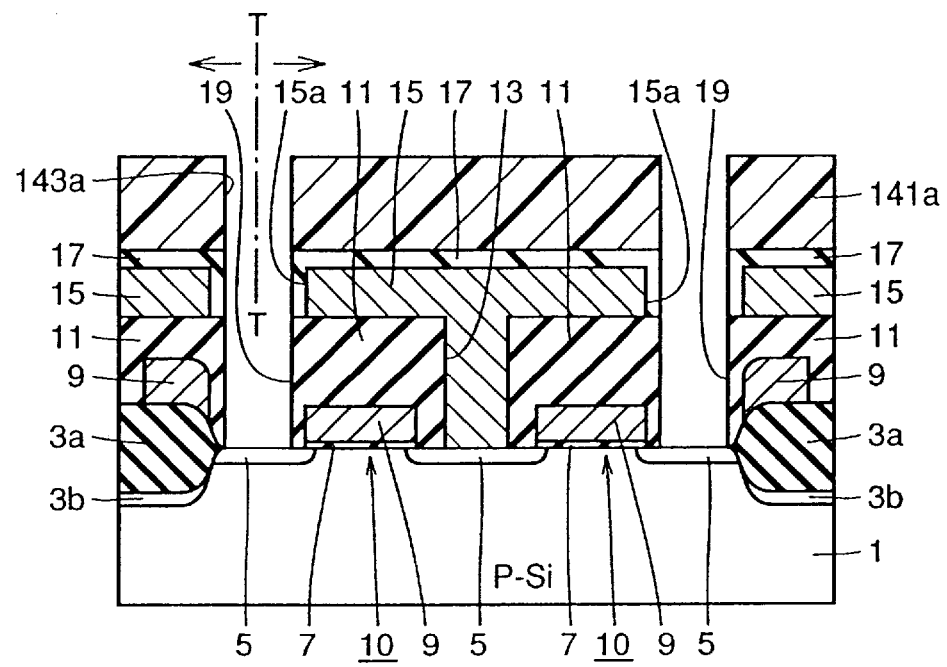
Figure 52:
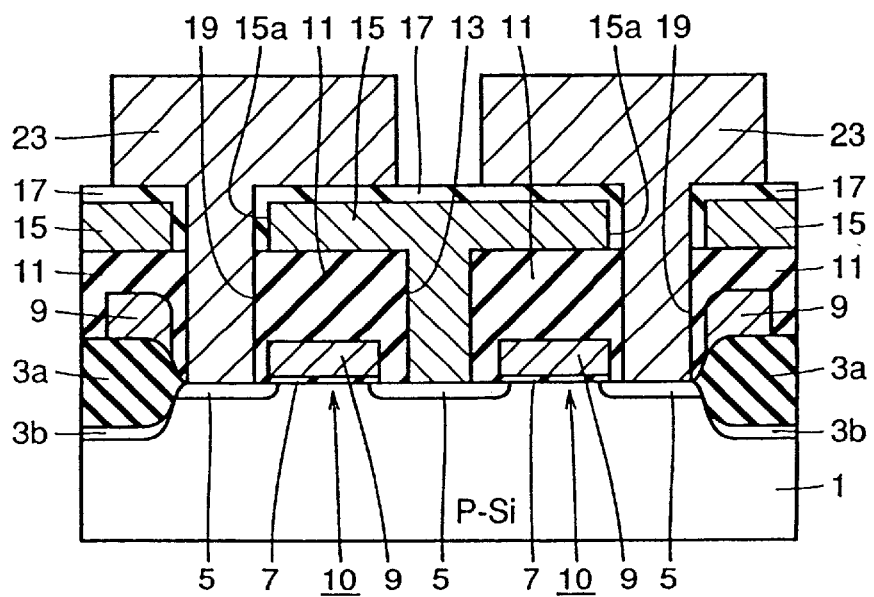
Figure 53:
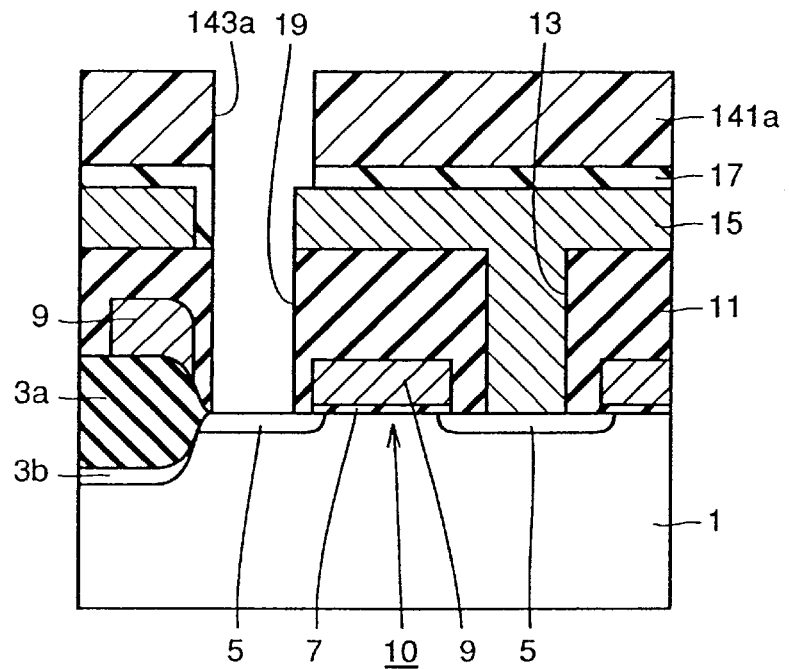
FIGS. 53 and 54 shows first and second steps illustrating a problem of a conventional semiconductor memory device, respectively.
Figure 54:
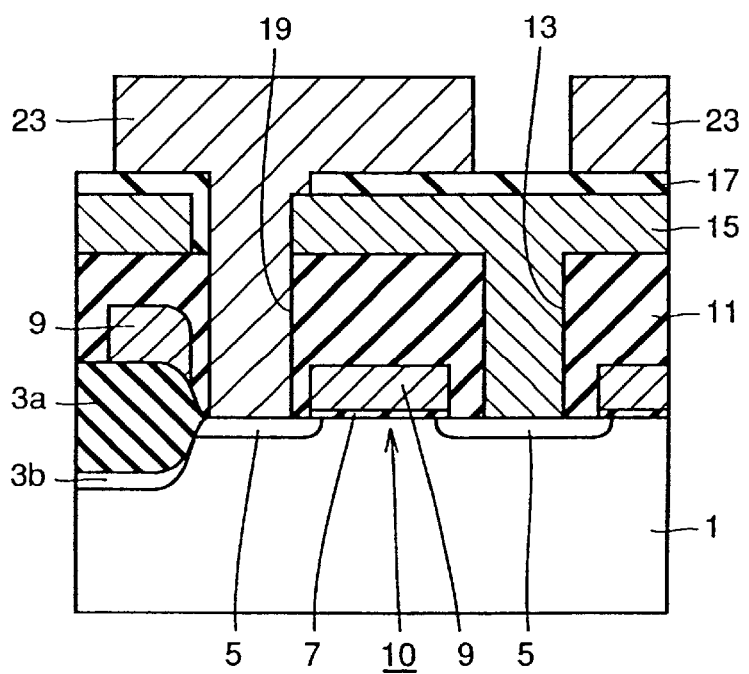
Figure 55:
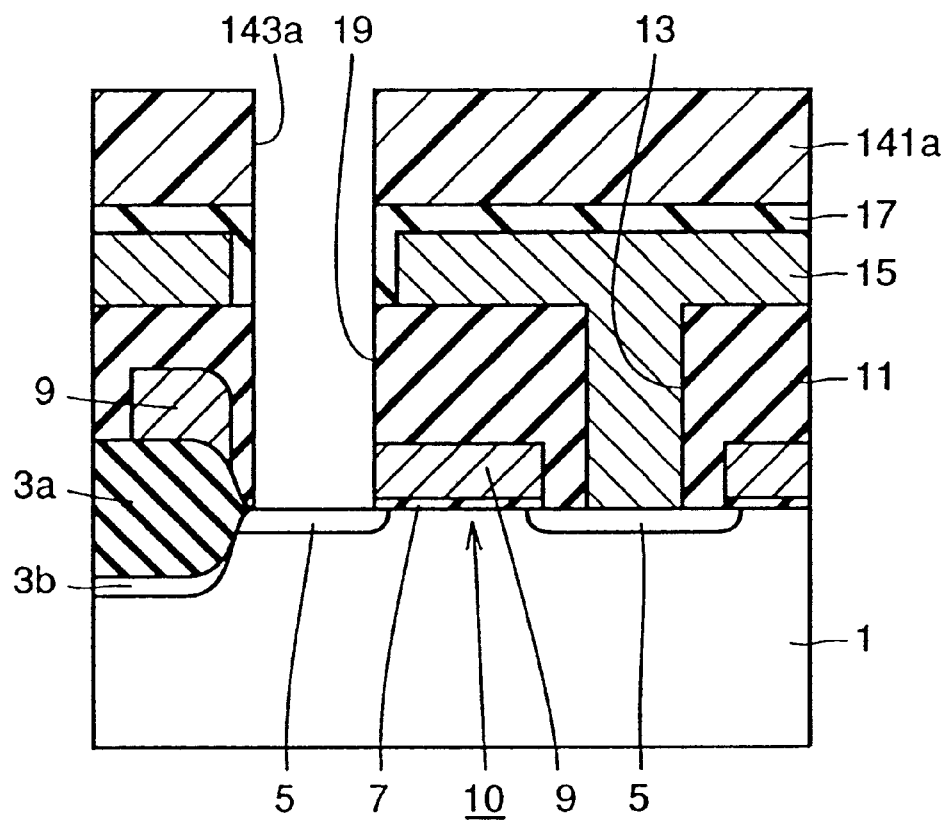
FIG. 55 is a schematic cross sectional view illustrating a problem of a conventional semiconductor memory device.

In the conventional manufacturing method shown in FIGS. 49–52, through hole 15a is first formed in bit line 15 and then contact hole 19 is formed such that it passes through hole 15a. That is, through hole 15a in bit line 15 is not formed simultaneously with the formation of contact hole 19. Therefore, if resist pattern 141a shown in FIG. 51 is displaced due to misregistration of the mask, bit line 15 will be exposed at contact hole 19, as described with reference to FIG. 53. In this case, when storage node 23 is formed as shown in FIG. 54, storage node 23 and bit line 15 will be short-circuited.

Figure 11:
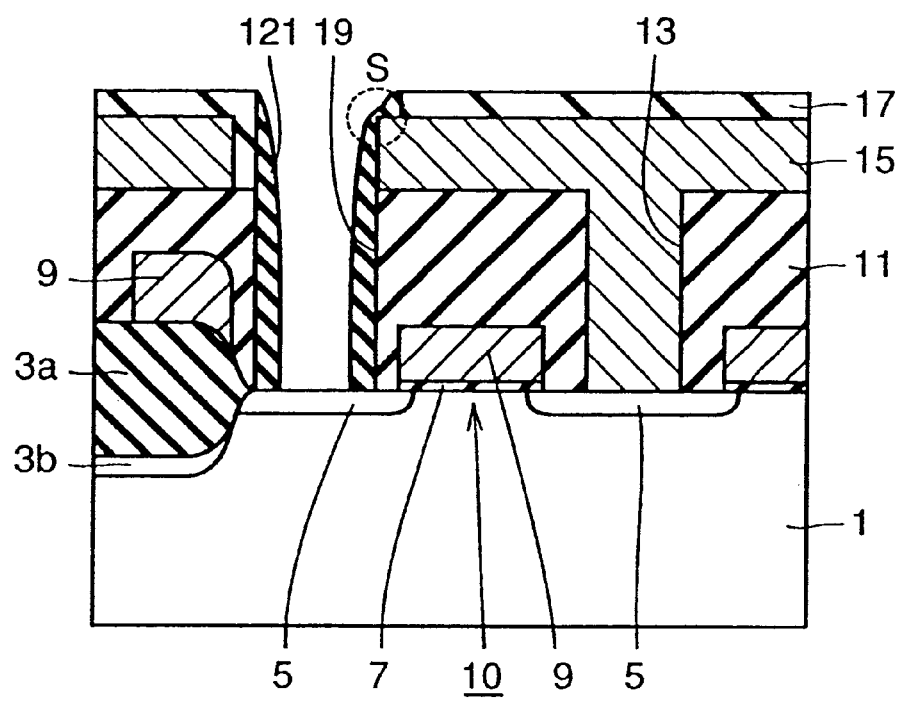
FIG. 11 is a cross sectional view illustrating a negative effect when applying the sidewall insulating layer to a conventional manufacturing method.

Here, short-circuit between the storage node and the bit line may be prevented by combining the method of forming a sidewall insulating layer described in Japanese Patent Laying-Open No. 5-75060 with the conventional manufacturing method. More specifically, a sidewall insulating layer is formed on the sidewall of contact hole 19 in the condition shown in FIG. 53 and the exposed surface of bit line 15 can be covered with sidewall insulating layer 21, as shown in FIG. 11. Thus, short-circuit between bit line 15 and storage node 23 is prevented.

At a protruding portion of bit line 15 such as the region 5 shown in FIG. 11, however, local film thickness of sidewall insulating layer 121 is extremely reduced. Therefore, when the storage node is formed such that it fills contact hole 19, the breakdown voltage between the storage node and bit line 15 will be lowered. Furthermore, in the worst case, bit line 15 is exposed at sidewall insulating layer 121 and consequently bit line 15 and storage node 23 will short-circuited.

Figure 12:
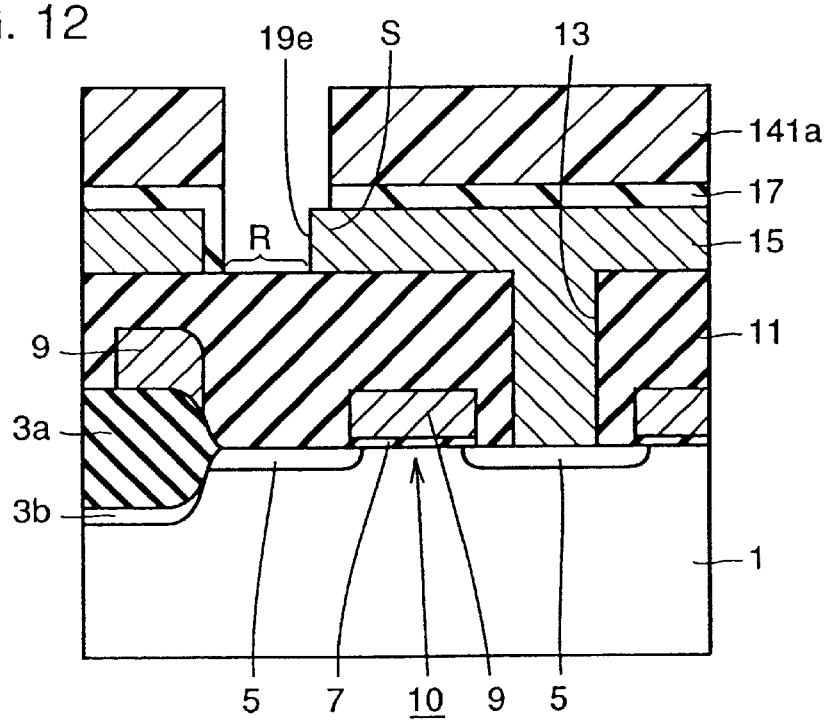
FIGS. 12–15 show process steps illustrating the negative effect when applying the sidewall insulating layer to the conventional manufacturing method.
Figure 13:
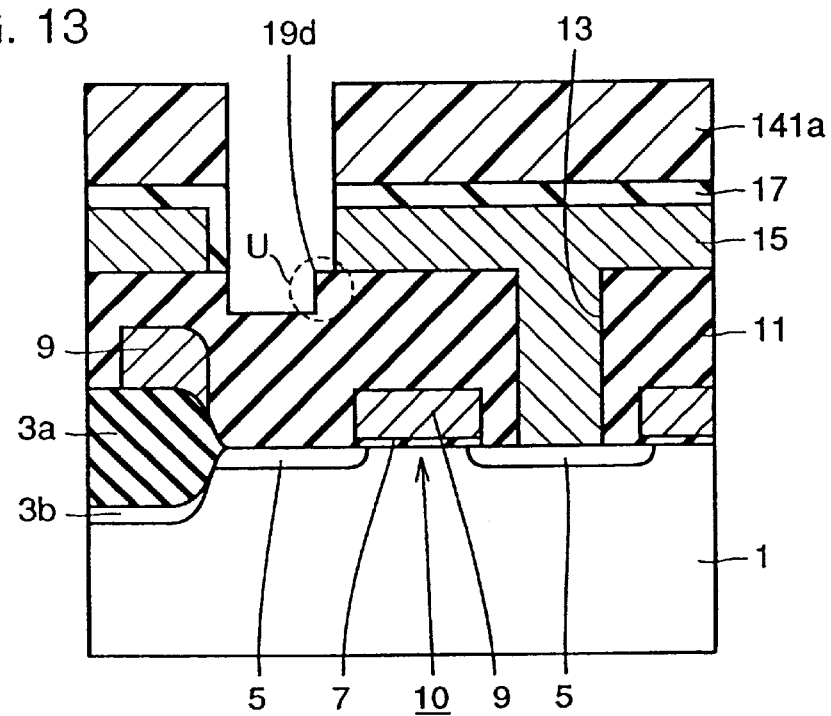
Figure 14:
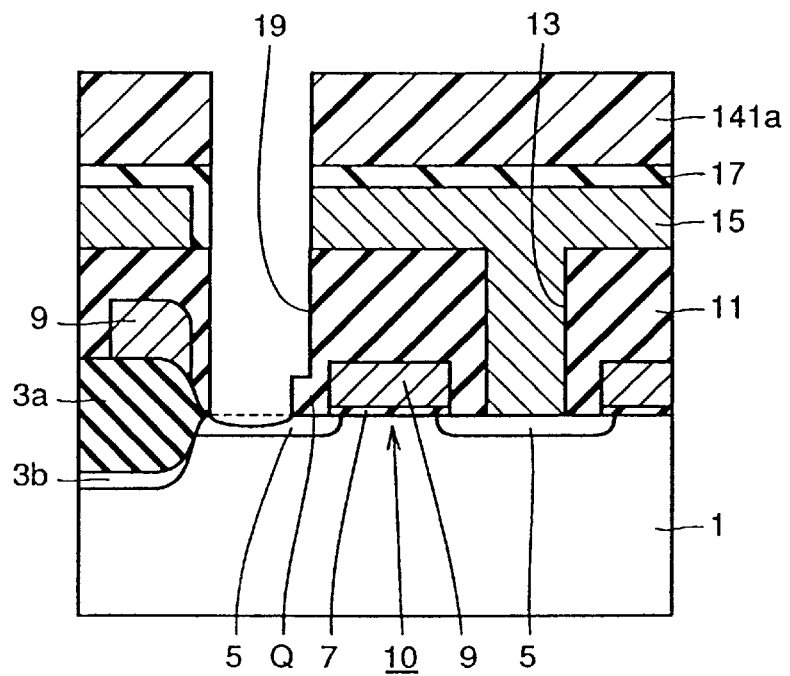

In view of the foregoing, in the process shown in FIGS. 12–14, the protruding portion of bit line 15 (the region S of FIG. 11) may be etched according to the shape of resist pattern 141a.

Referring to FIG. 12, if resist pattern 141a is displaced due to misregistration of the mask, anisotropical etching of interlayer insulating layer 17 would cause bit line 15 to be exposed, resulting in the protruding portion S of bit line 15. Then, the protruding portion S is etched.

Referring to FIG. 13, the protruding portion of bit line 15 is removed by this etching. However, in the etching of bit line 15, an exposed portion (the region R shown in FIG. 12) of interlayer insulating layer 11 is simultaneously etched. Therefore, the level difference U results at the bottom portion of the opening after bit line 15 is etched.

In this condition, further anisotropical etching is performed until a surface of p-type silicon substrate 1 is exposed.

Figure 15:
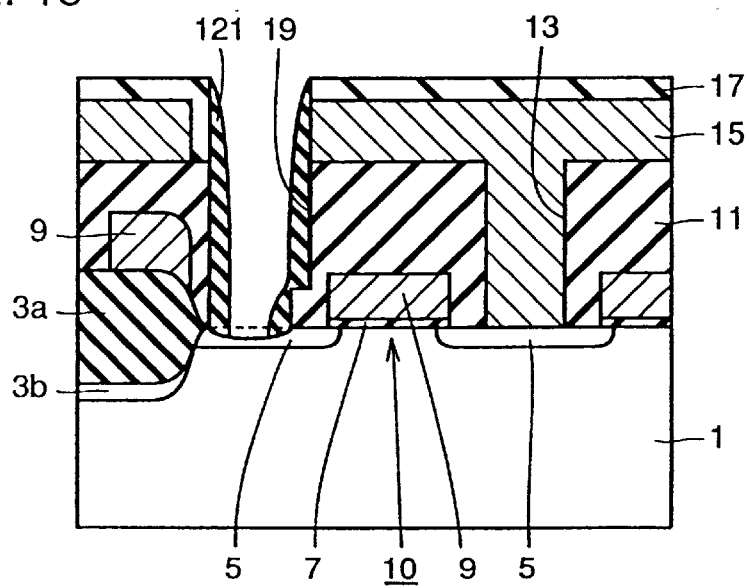

Referring to FIG. 14, this etching exposes the surface of p-type silicon substrate 1. However, since the level difference is reflected as it is, a portion (the portion Q) of interlayer insulating layer 11 remains on a surface of p-type silicon substrate 1 which should be exposed. Therefore, contact area of the storage node and p-type silicon substrate 1 is decreased. Furthermore, when sidewall insulating layer 121 is formed as shown in FIG. 15, the exposed portion of p-type silicon substrate 1 is still made smaller. Therefore, the contact area of the storage node and p-type silicon substrate 1 is reduced and contact resistance is undesirably increased.

If further etching is performed in the process shown in FIG. 14 in order to remove the level difference (the portion Q), the surface of p-type silicon substrate 1 which has been exposed would further be etched away and the surface would be scraped away. If the storage node contacts p-type silicon substrate 1 at the portion where the surface is thus scraped away, contact resistance would be increased.

Thus, if the process for forming a sidewall insulating layer is applied to the conventional manufacturing method, breakdown voltage between the storage node and the bit line would be decreased, or contact resistance between the storage node and p-type silicon substrate 1 would be increased.

On the other hand, in the method of the present embodiment, the through hole in bit line 15 is formed simultaneously with the formation of the contact hole, as shown in the process of FIGS. 5–7. Therefore, the problem mentioned above will not occur so that a semiconductor memory device can be obtained which ensures a sufficient breakdown voltage between the storage node and the bit line and provides small contact resistance between the storage node and the p-type silicon substrate.

In the above embodiment, an example of a planar layout of ½ pitch (a half pitch) is described, as shown in FIG. 1. However, the present invention is not limited to this example and may be applied to a planar layout structure with highest density, of cells for ¼ pitch (a quarter pitch) or ⅓ pitch, as shown in FIGS. 16 and 17.

Figure 16:
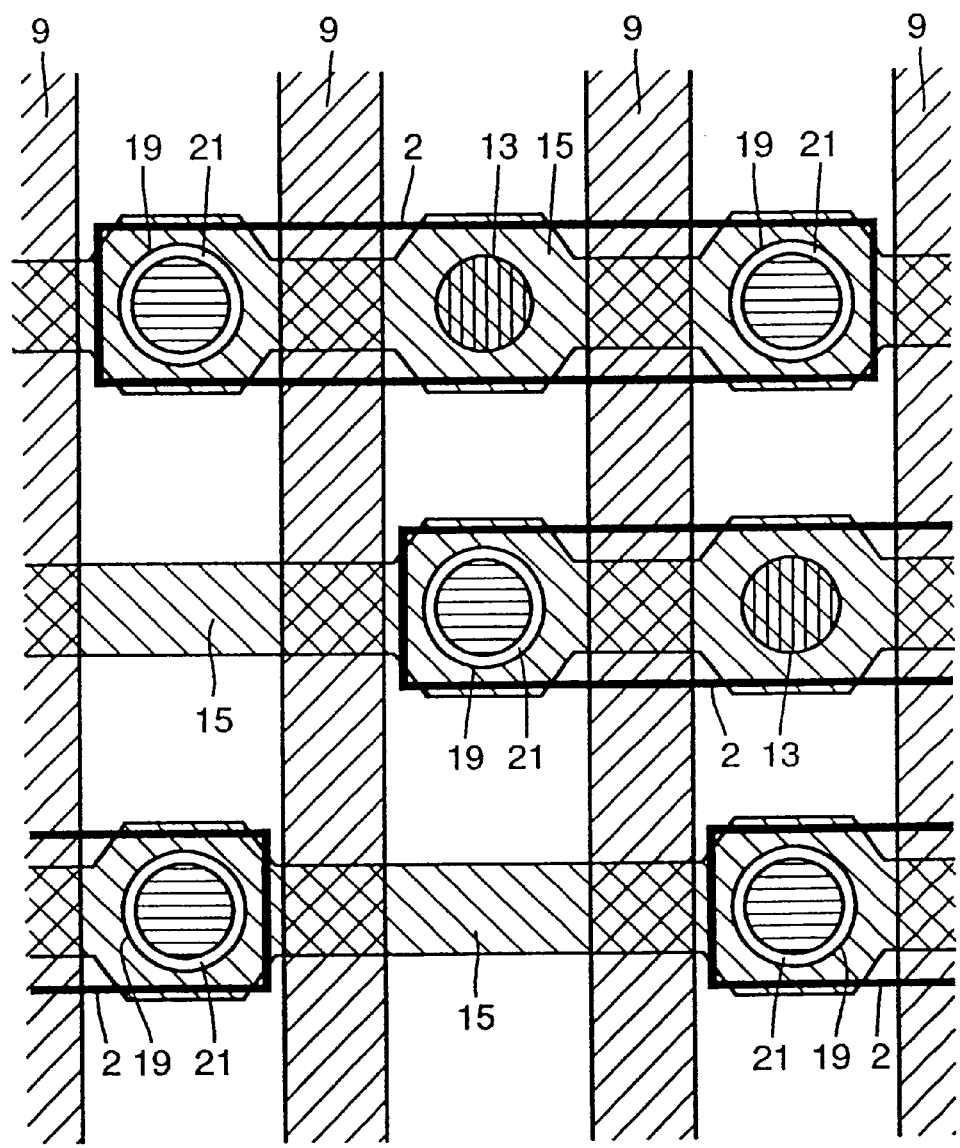
FIG. 16 is a schematic plan view of a planar layout of ¼ pitch.
Figure 17:
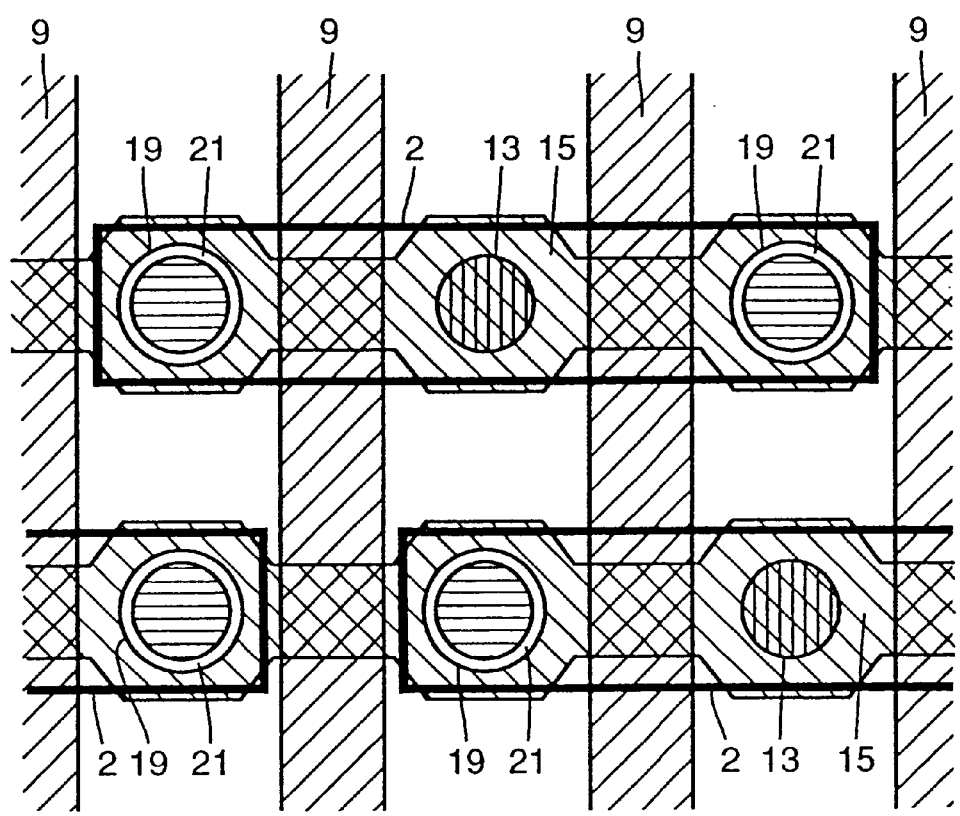
FIG. 17 is a schematic plan view of a planar layout of ⅓ pitch.

The reference numerals shown in FIGS. 16 and 17 indicate the components indicated by the same reference numerals shown in FIG. 1.

In the manufacturing method according to the first embodiment, the following problems (a)–(c) may occur.

Figure 18:
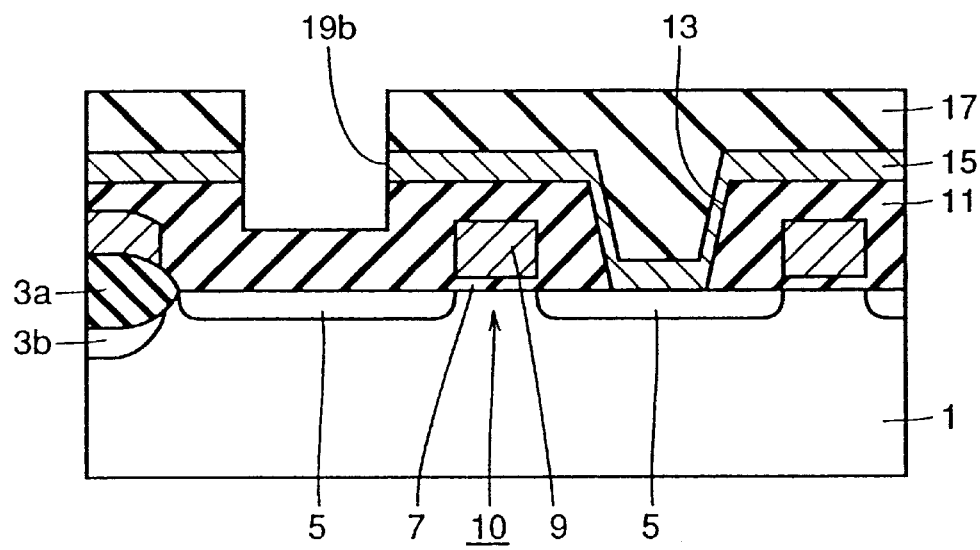

(a) In the manufacturing method according to the first embodiment, when contact hole 19 is formed in the process shown in FIGS. 5–7, interlayer insulating layers 11, 17 and bit line 15 are continuously etched using the same resist pattern 41a. In practice, resist pattern 41a is also etched in this etching. Therefore, resist pattern 41a could be lost, as shown in FIG. 18, when interlayer insulating g layer 11 is etched in the process shown in FIGS. 6 and 7.

Figure 19:
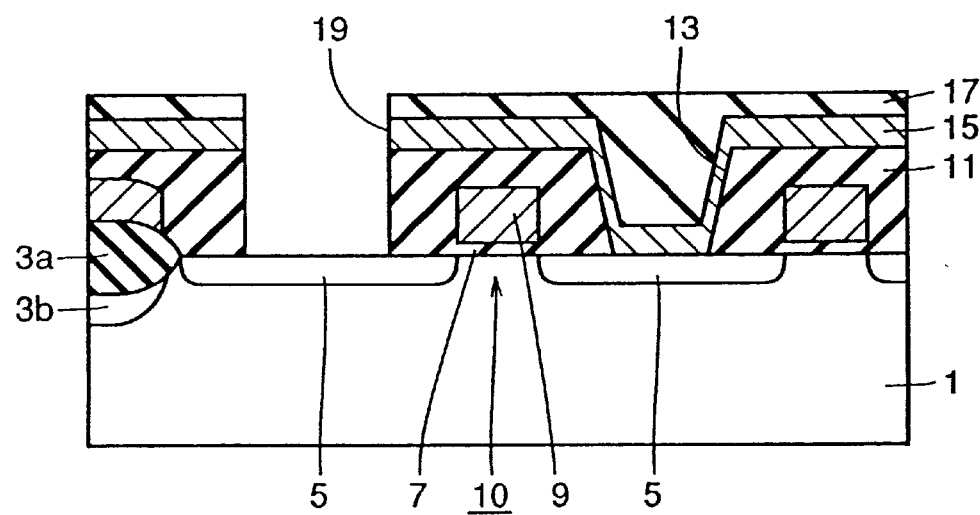

Furthermore, when the etching is continued until p type silicon substrate 1 is reached, the film thickness of interlayer insulating layer 17 is reduced as compared with a desired film thickness, as shown in FIG. 19. Therefore, insulation between storage node 23 formed on interlayer insulating layer 17 and bit line 15 cannot be maintained.

In the worst case, interlayer insulating layer 17 in FIG. 19 will be completely etched away when contact hole 19 is formed. In this case, storage node 23 and bit line 15 completely short-circuits.

Figure 20:
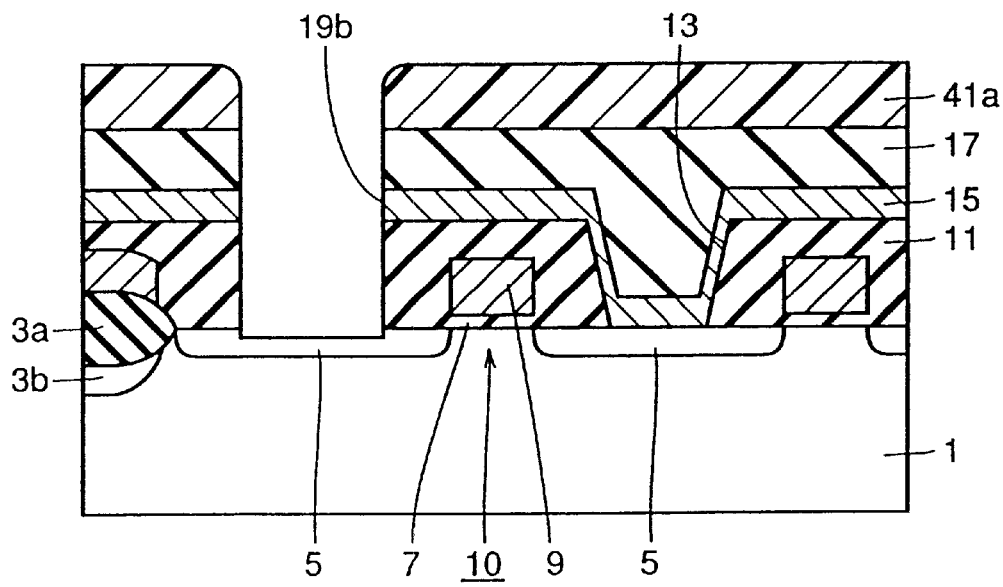
FIGS. 20 and 21 are the first and second steps illustrating a second problem of the method of manufacturing a semiconductor memory device according to the first embodiment of the present invention, respectively.
Figure 21:
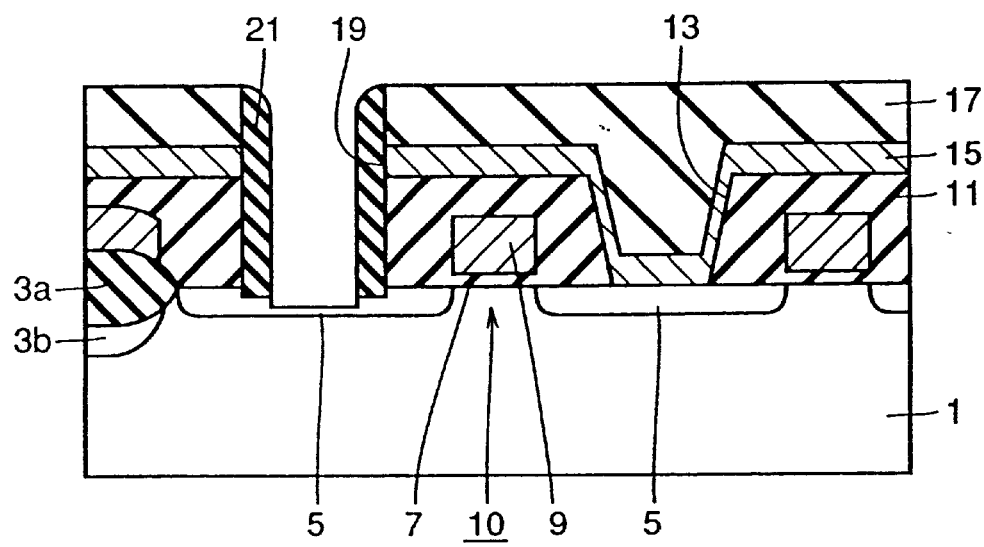

(b) Typically, interlayer insulating layer 11 is over-etched in the process shown in FIGS. 6 and 7. This causes a surface p type silicon substrate 1 to be scraped off, as shown in FIG. 20, causing crystal defect therein. P type silicon substrate 1 is also etched and scraped off, as shown in FIG. 21, in forming sidewall insulating layer 21 in the process shown in FIGS. 8 and 9, causing crystal defect in p type silicon substrate 1.

Thus, in the manufacturing method according to the first embodiment, since p type silicon substrate 1 is etched twice and thus defect is caused therein, p type silicon substrate 1 will have a large amount of crystal defect. If the crystal defect is taken into a depletion layer of a pn junction formed of source/drain regions 5 and p type silicon substrate 1, leakage current will generate from the crystal defect. Particularly in the first embodiment, larger leakage current will generate since a large amount of crystal defect is introduced.

Figure 22:
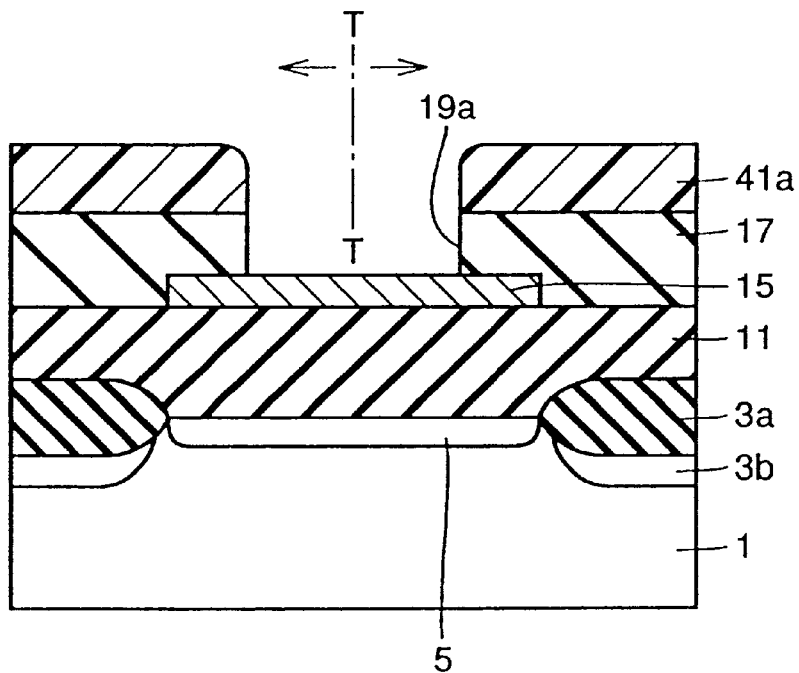
FIGS. 22, 23 and 24 are the first, second and third steps illustrating a third problem of the method of manufacturing a semiconductor memory device according to the first embodiment of the present invention.

(c) FIG. 22 is a schematic cross sectional view corresponding to the process shown in FIG. 5, taken along the line XXXV—XXXV of FIG. 1. Referring to FIG. 22, when there is mask misregistration in photolithography in the process, the center (T—T) of a hole pattern for resist pattern 41a is displaced to the right or left side in the figure.

Figure 23:
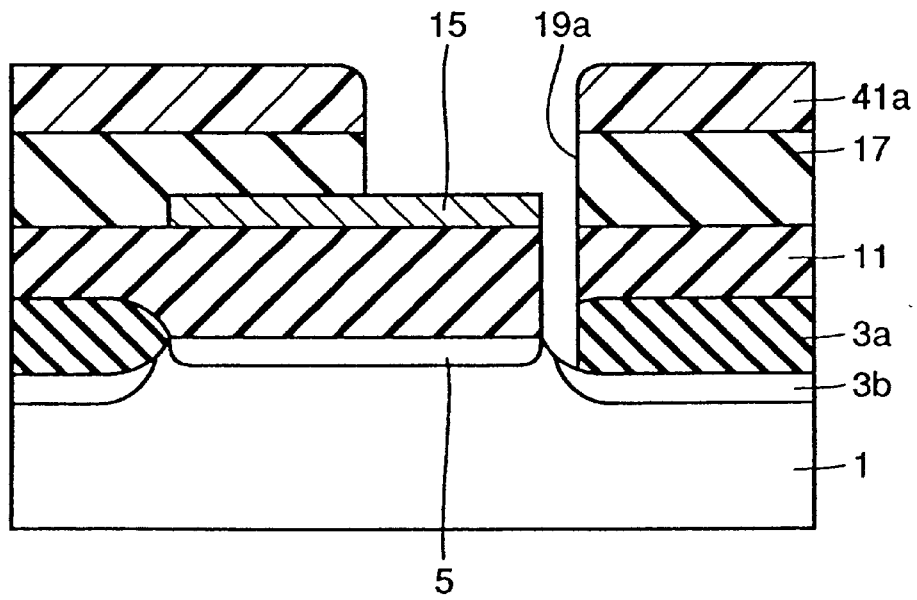
Figure 24:
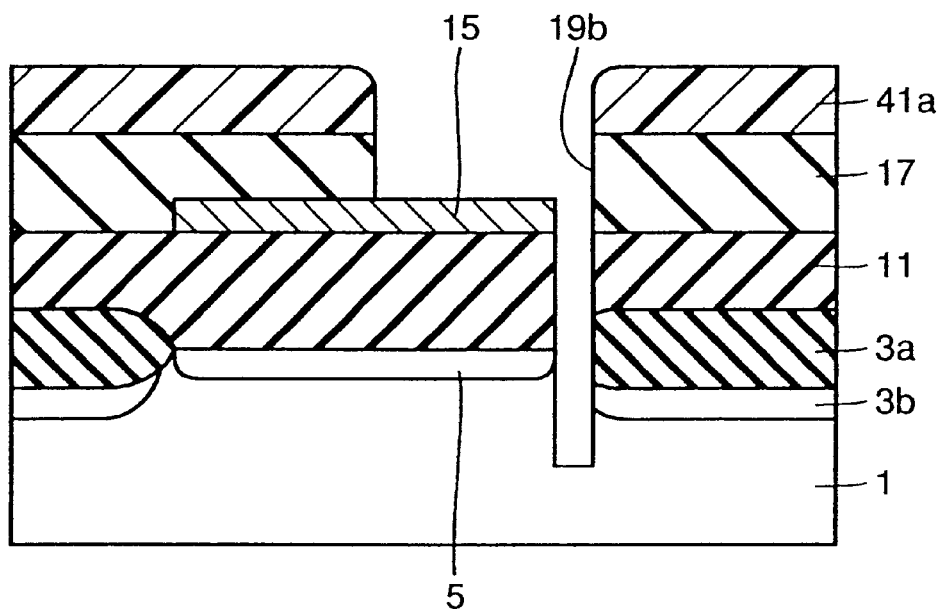

When the hole pattern for resist pattern 41a is displaced to the right side in the figure, as shown in FIG. 23, for example, an opening 19a could undesirably reach a surface of p type silicon substrate 1 due to over-etching at the time of etching interlayer insulating layer 17. When bit line 15 is etched in this condition, p type silicon substrate 1 is deeply scraped off, as shown in FIG. 24.

Thereafter, when storage node 23 is formed, it directly contacts with source/drain regions 5 as well as p type silicon substrate 1. This causes electric charge to be stored in storage node 23 to escape therefrom to p type silicon substrate 1 so that the DRAM cannot operate accurately.

It is effective to use the manufacturing methods described in the following second to fifth embodiments when any of the above problems (a)–(c) is caused. The second to fifth embodiments will now be described.

[Second Embodiment]

Figure 25:
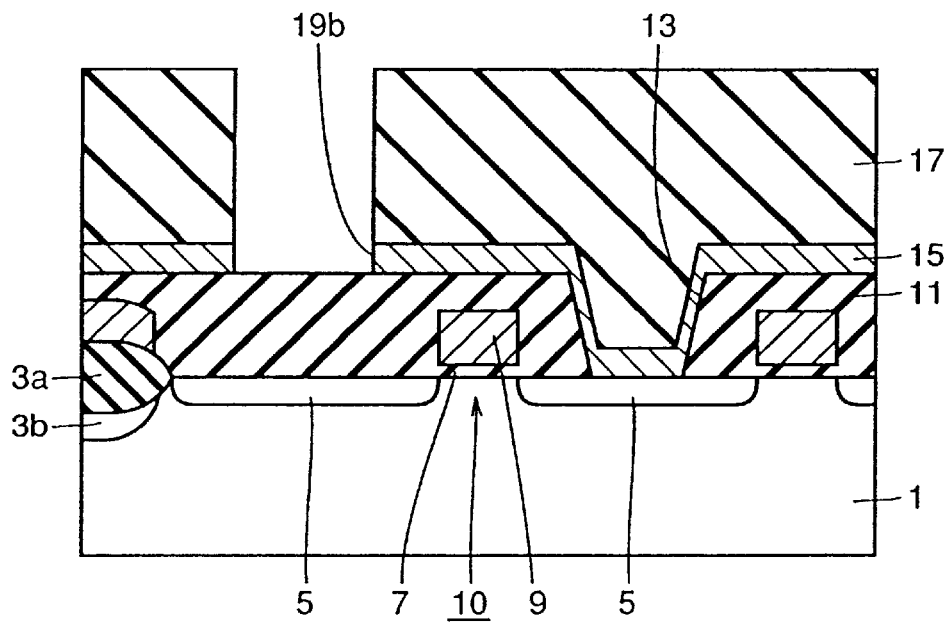
FIGS. 25, 26 and 27 are schematic cross sectional views illustrating the first, second and third steps of a method of manufacturing a semiconductor memory device according to a second embodiment of the present invention, respectively.
Figure 26:
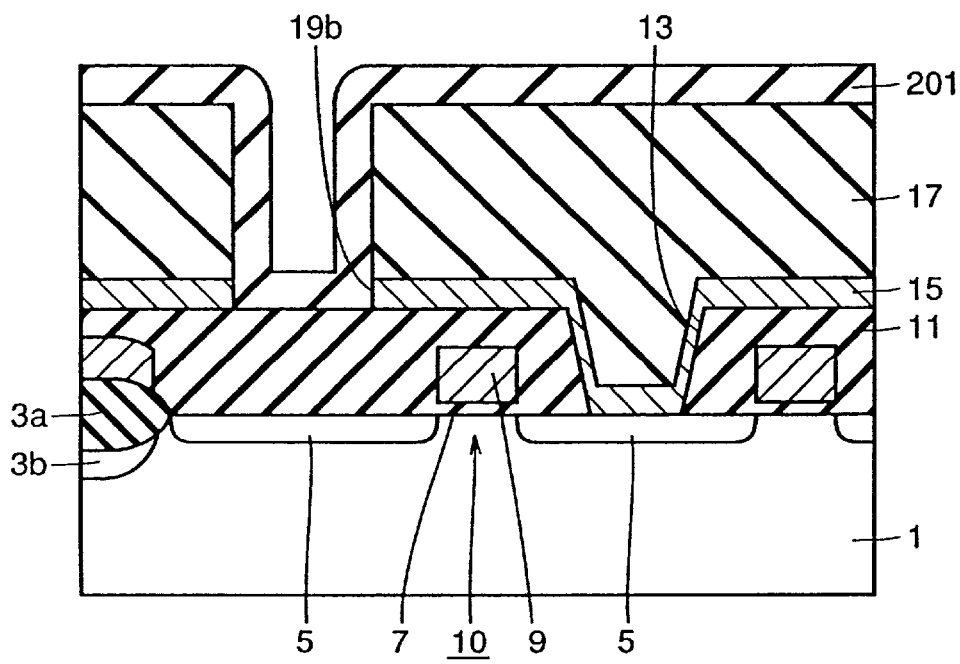
Figure 27:
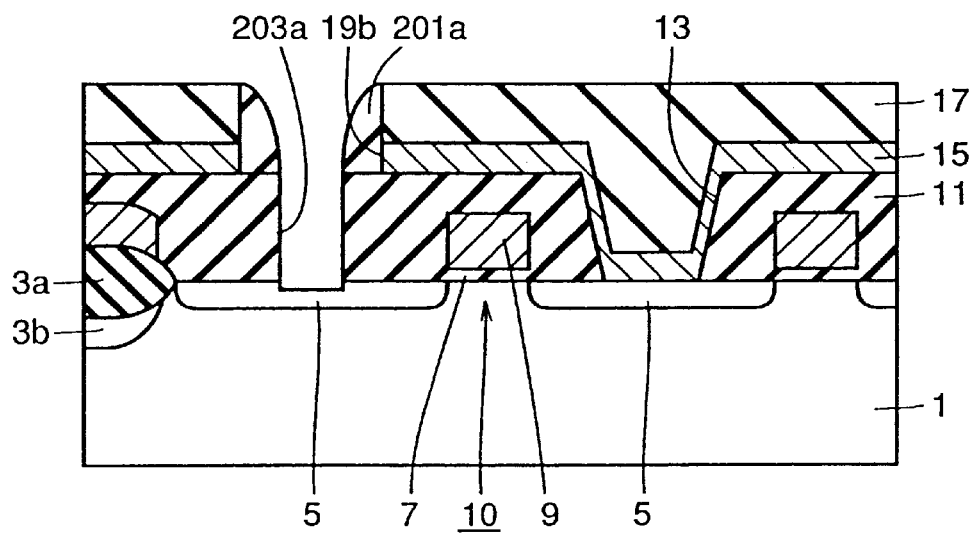

FIGS. 25–27 are schematic sectional views illustrating, in order, the steps of a method of manufacturing a semiconductor memory device according to the second embodiment of the present invention.

In the manufacturing method according to the present embodiment, similar steps to those of the first embodiment shown in FIGS. 4–6 are first performed. Interlayer insulating layer 11 is formed of silicon oxide film to a film thickness of 2000 Å–4000 Å, for example. Bit line 15 is formed of polycrystalline silicon introduced with an impurity to a film thickness of 500 Å–1000 Å, for example. Interlayer insulating layer 17 is formed of silicon oxide film to a film thickness of 3000 Å–6000 Å, for example.

Resist pattern 41a is then removed, as shown in FIG. 25.

Referring now to FIG. 26, an insulating layer 201 of a silicon oxide film is formed on the entire surface to a film thickness of 0.1 $\mu$m, for example, by the CVD method. Insulating layer 201 may be formed of a silicon nitride film of a film thickness of 0.1 $\mu$m formed, for example, by the CVD method. Preferably, insulating layer 201 is formed of a material the etching rate of which is almost the same as that of interlayer insulating layer 11, 17. An opening 19b is of the minimum dimension which can be processed, for example, in photolithography, currently being approximately 0.4 $\mu$m. The entire surface of insulating layer 201 is then anisotropically etched.

Referring to FIG. 27, a surface of interlayer insulating layer 17 is exposed and a surface of interlayer insulating layer 11 is exposed at a bottom portion of opening 19b by the anisotropic etching. Furthermore, a sidewall insulating layer 201a is formed of insulating layer 201 such that it covers a sidewall of bit line 15 at a sidewall of opening 19b. Thereafter, the anisotropic etching is continued to etch the exposed surface of interlayer insulating layer 11, thus forming a contact hole 203a reaching source/drain regions 5.

In the manufacturing method according to the present embodiment, interlayer insulating layers 11, 17 and bit line 15 are not etched continuously, but only interlayer insulating layer 17 and bit line 15 are etched, with resist pattern 41a used as a mask. Then, insulating layer 201 is formed on the entire surface, as shown in FIG. 26, and thereafter interlayer insulating layer 11 is etched. Thus, insulating layer 17 on bit line 15 is not lost when interlayer insulating layer 11 is etched (i.e., problem (a)).

Furthermore, since the surface of p type silicon substrate 1 is etched only once, as shown in FIG. 27, the frequency of etching of substrate 1 is reduced as compared with the first embodiment in which substrate 1 is etched twice, and thus generation of leakage current (i.e., problem (b)) can be restrained.

[Third Embodiment]

Figure 28:
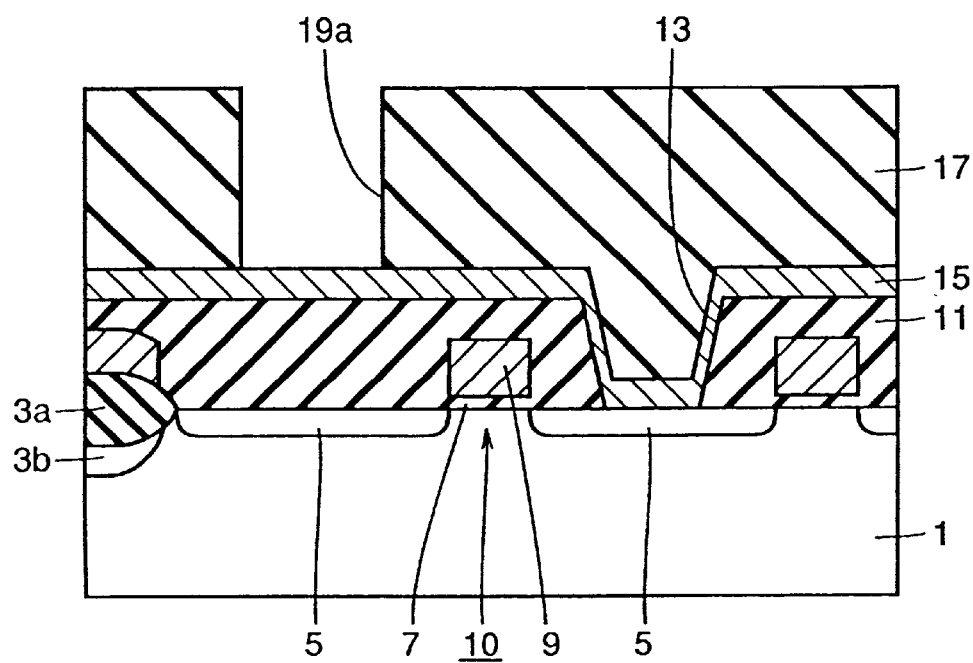
FIG. 28 is a schematic cross sectional view illustrating a step of a method of manufacturing a semiconductor memory device according to a third embodiment of the present invention.

FIG. 28 is a schematic cross sectional view illustrating a step of a method of manufacturing a semiconductor memory device according to the third embodiment of the present invention.

In the manufacturing method according to the present embodiment, similar steps to those of the first embodiment shown in FIGS. 4 and 5 are first performed. The thickness and material of each of layers 11, 15, 17 in this condition are almost the same as those described in the second embodiment. Resist pattern 41a is then removed, as shown in FIG. 28.

Then, referring to FIG. 28, interlayer insulating layer 17 is used as a mask and bit line 15 is anisotropically etched, as shown in FIG. 25. Thereafter, as shown in FIGS. 26 and 27, similar steps described in the second embodiment are performed to form contact hole 203a.

In the manufacturing method according to the present embodiment, similar to the second embodiment, interlayer insulating layers 11, 17 and bit line 15 are not etched continuously, but only interlayer insulating layer 17 is etched, with resist pattern 41a used as a mask. Thus, the insulating layer on bit line 15 is not lost.

Furthermore, since p type silicon substrate 1 is etched only once, as shown in FIG. 27, generation of leakage current due to introduction of crystal defect can be restrained as with the second embodiment.

[Fourth Embodiment]

FIGS. 29–34 and FIGS. 35–41 are schematic cross sectional views illustrating, in order, the steps of a method of manufacturing a semiconductor memory device according to the fourth embodiment, taken along the lines II—II and XXXV—XXXV of FIG. 1, respectively.

Figure 35:
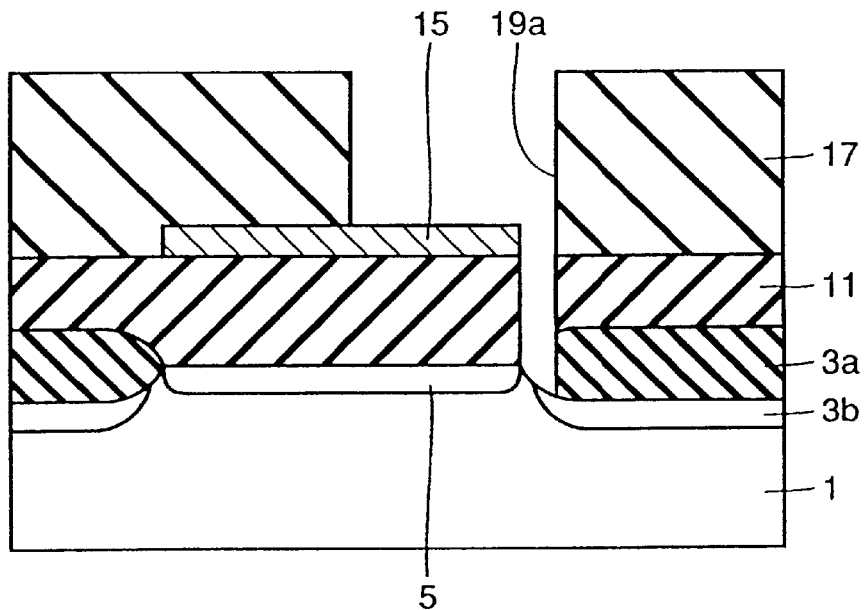
FIGS. 35–41 are schematic cross sectional views, taken along the line XXXV—XXXV of FIG. 1, illustrating the first to seventh steps of the method of manufacturing a semiconductor memory device according to the fourth embodiment of the present invention, respectively.

In the manufacturing method according to the present embodiment, similar steps to those of the second embodiment are first performed up to the step shown in FIG. 28. FIG. 35 corresponds to the process shown in FIG. 28, showing the case where opening 19a is displaced due to mask misregistration.

Figure 29:
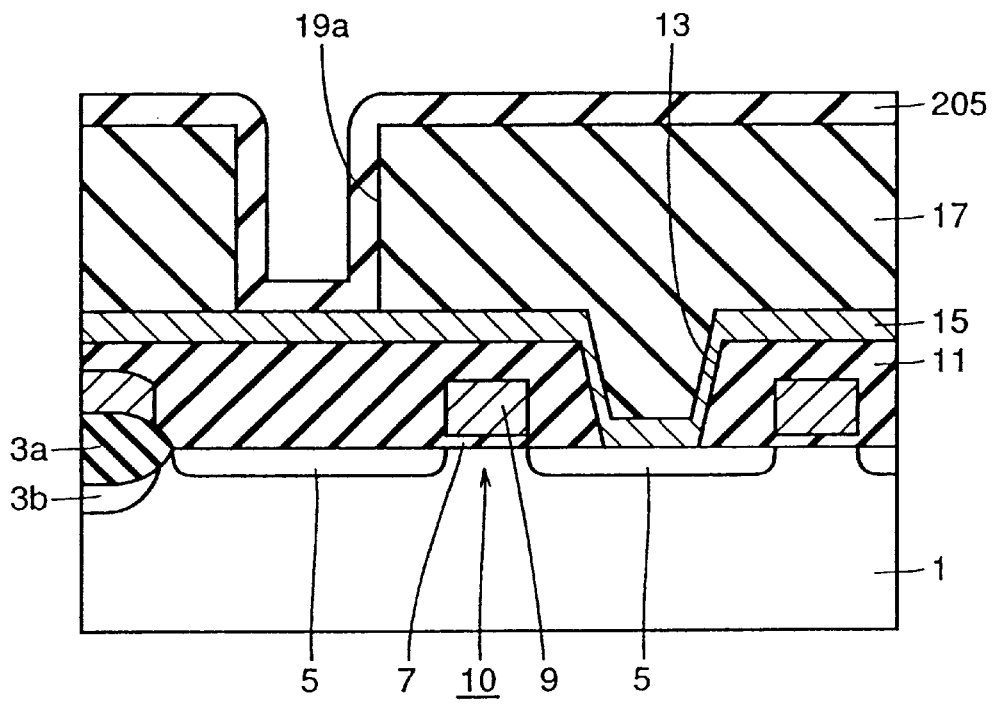
FIGS. 29–34 are schematic cross sectional views, taken along the line II—II of FIG. 1, illustrating the first to sixth steps of a method of manufacturing a semiconductor memory device according to a fourth embodiment of the present invention, respectively.
Figure 36:
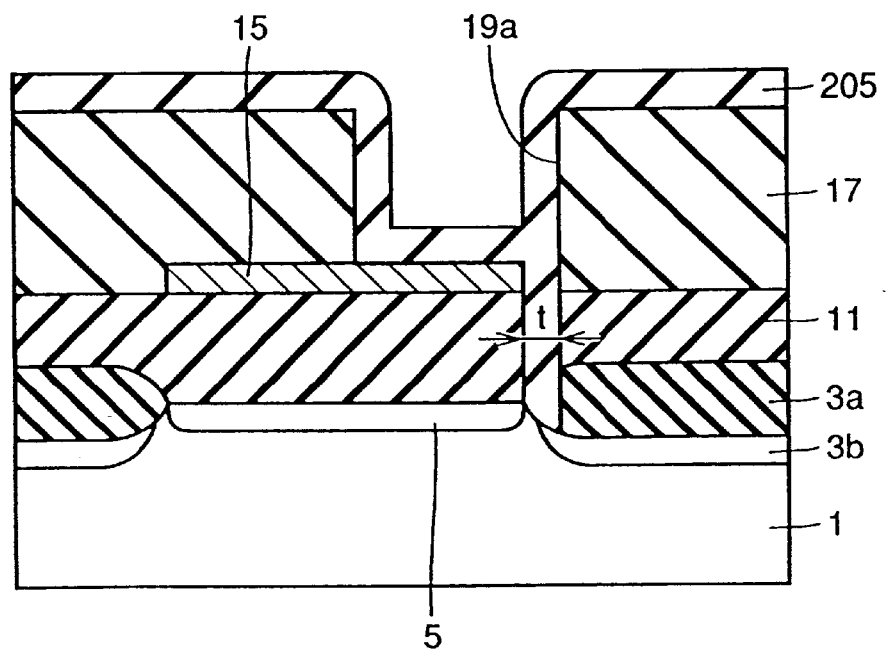

Then, referring to FIGS. 29 and 36, an insulating layer 205 is formed to completely fill the portion of opening 19a having a width of t and to cover the rest of the internal wall of opening 19a. Insulating layer 205 is a silicon oxide film or a silicon nitride film formed, for example, by the CVD method to a film thickness of 0.1 $\mu$m. Furthermore, insulating layer 205 is preferably formed of a material the etching rate of which is almost the same as that of interlayer insulating layer 11, 17. Furthermore, the film thickness of insulating layer 205 is preferably more than half the width t of opening 19a. The entire surface of insulting layer 205 is anisotropically etched.

Figure 30:
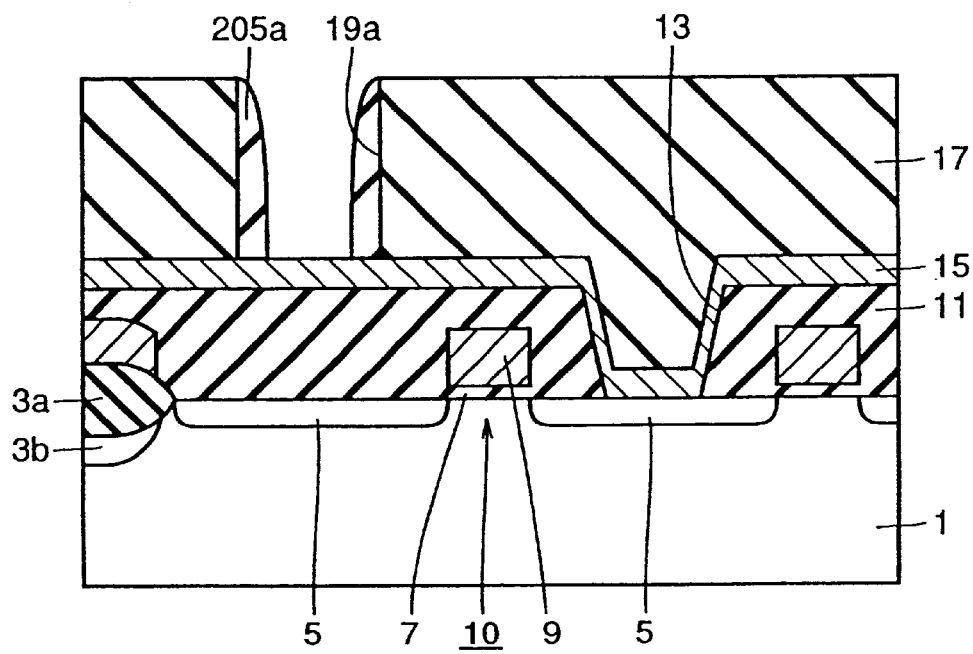
Figure 37:
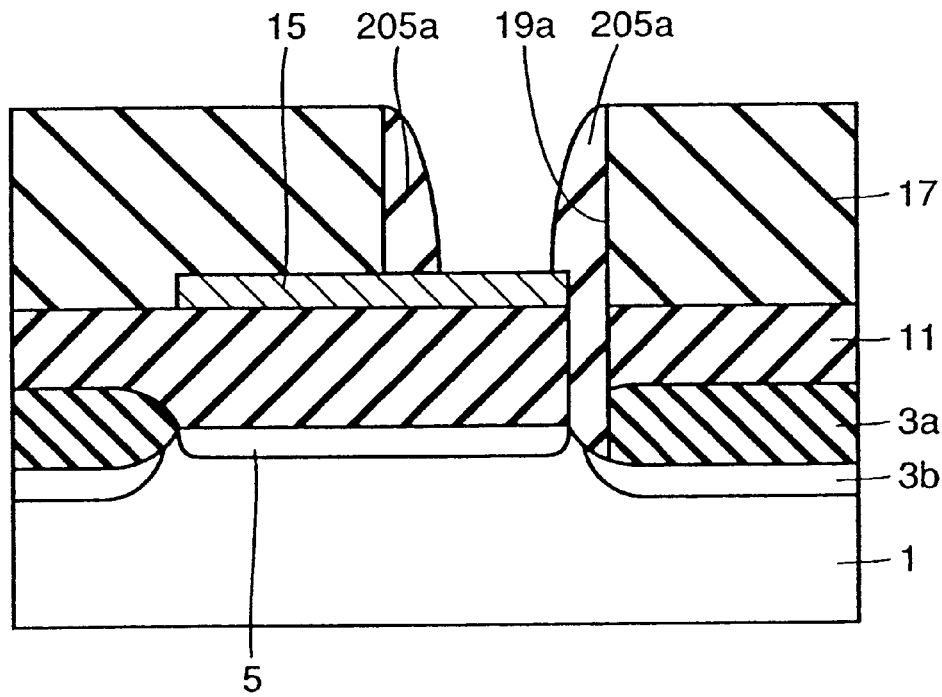

Referring to FIGS. 30 and 37, a sidewall insulating layer 205a is formed which completely fills the region of opening 19a having the width t and covers the rest of the sidewall of opening 19a by the anisotropic etching. Then, sidewall insulating layer 205a and interlayer insulating layer 17 are used as a mask and bit line 15 is anistropically etched.

Figure 31:
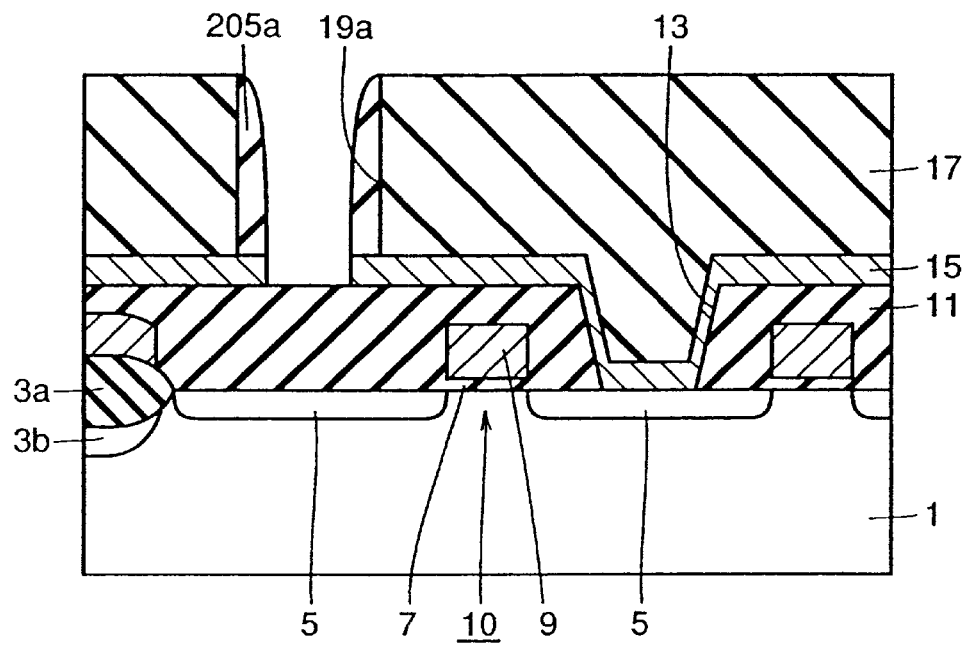
Figure 38:
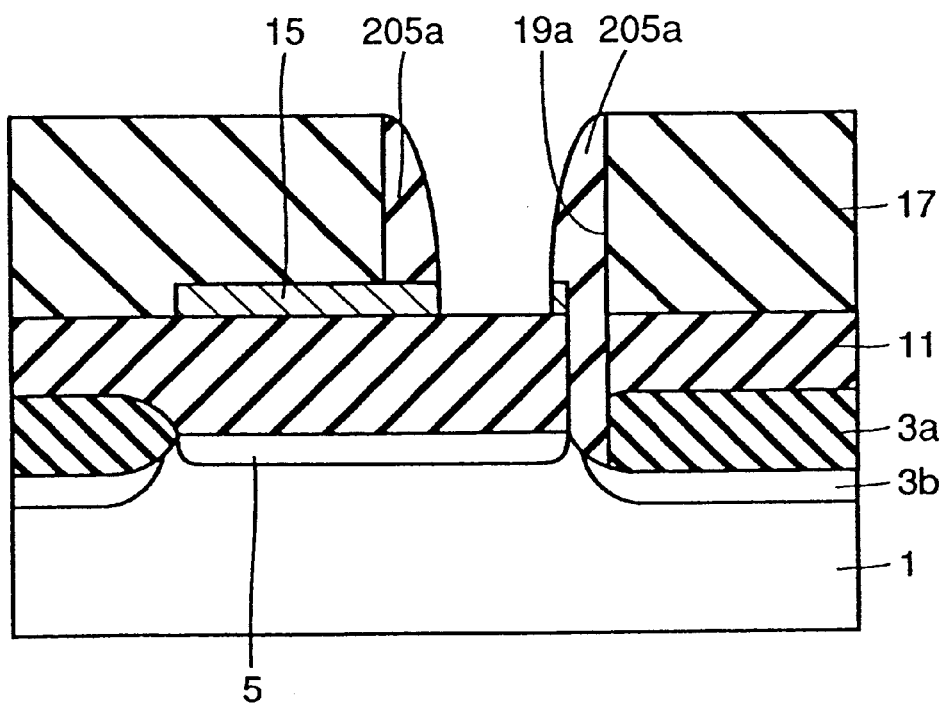

Referring to FIGS. 31 and 38, a surface of interlayer insulating layer 11 is exposed by the anisotropic etching. Then, the exposed surface of interlayer insulating layer 11 is anisotropically etched.

Figure 32:
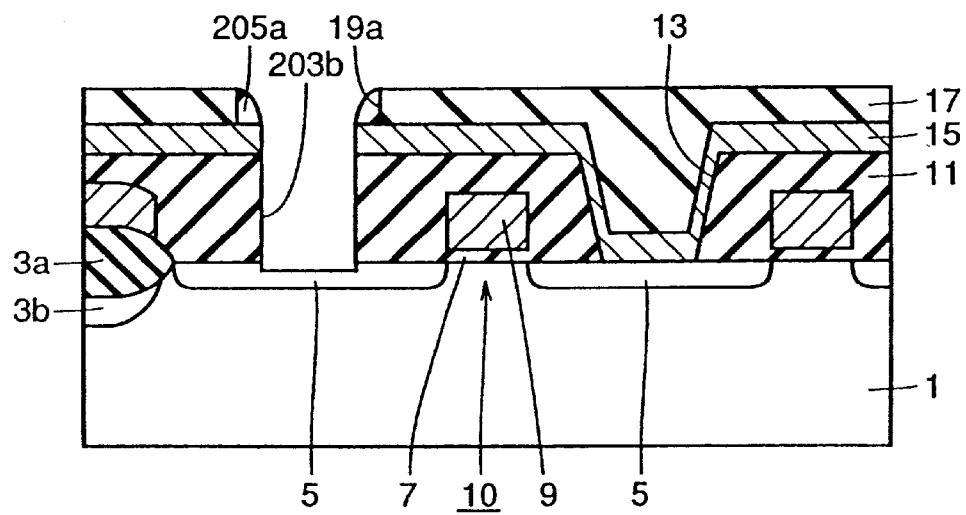
Figure 39:
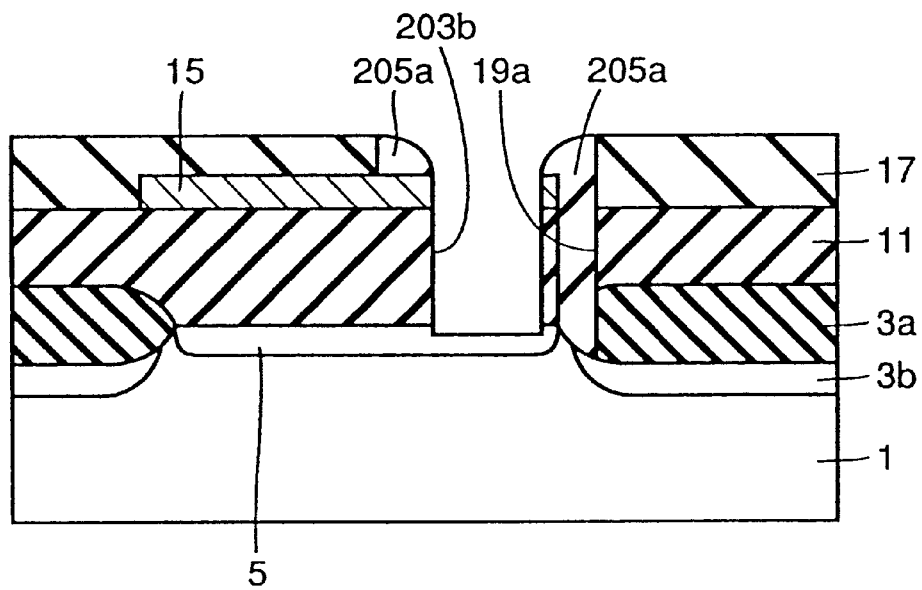

Referring to FIGS. 32 and 39, interlayer insulating layer 11 is penetrated by the anisotropic etching to form an opening 203b reaching p type silicon substrate 1.

Figure 33:
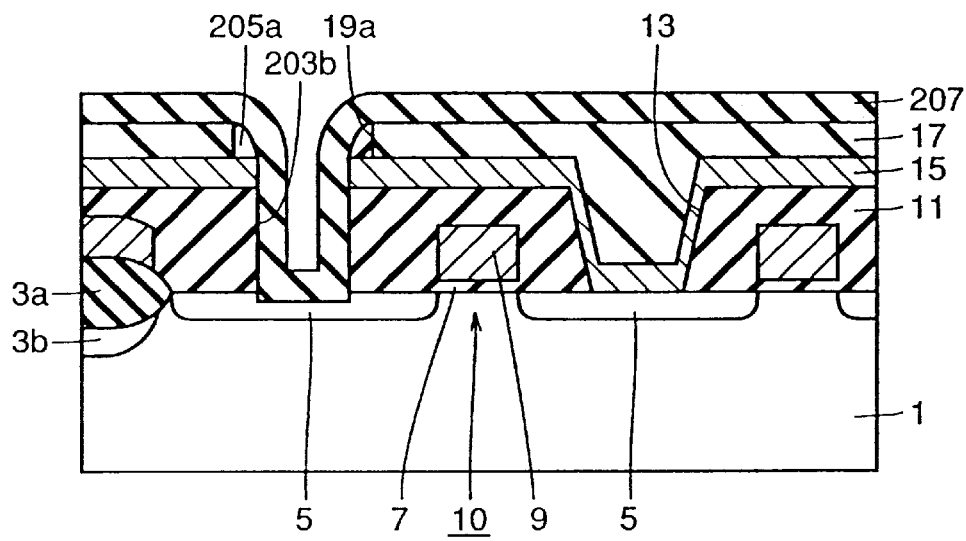
Figure 40:
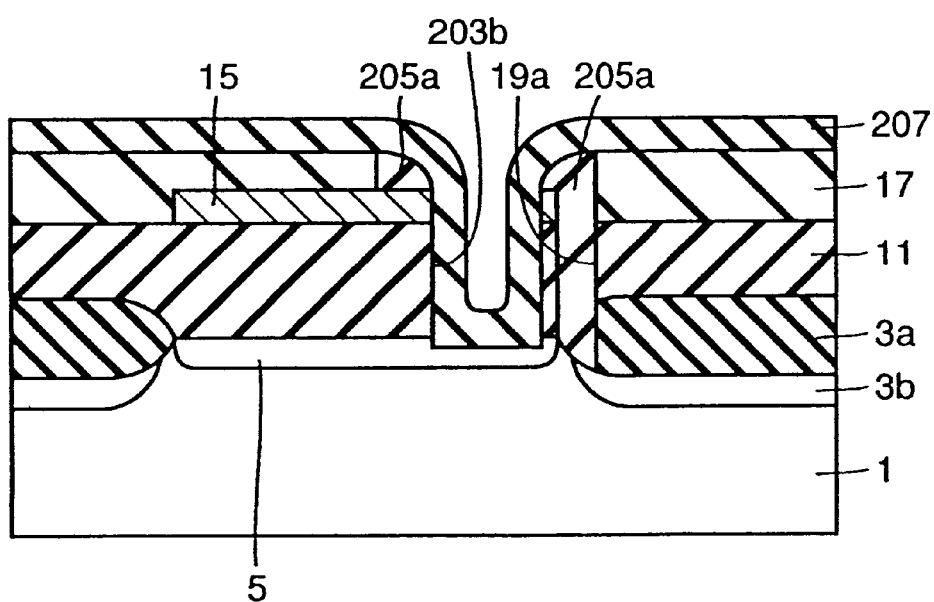

Referring to FIGS. 33 and 40, an insulating layer 207 is formed to cover the surface of the internal wall of opening 203b and the surface of interlayer insulating layer 11. Insulating layer 207 is a silicon oxide film or a silicon nitride film formed, for example, by the CVD method. This entire surface of insulating layer 207 is anisotropically etched.

Figure 34:
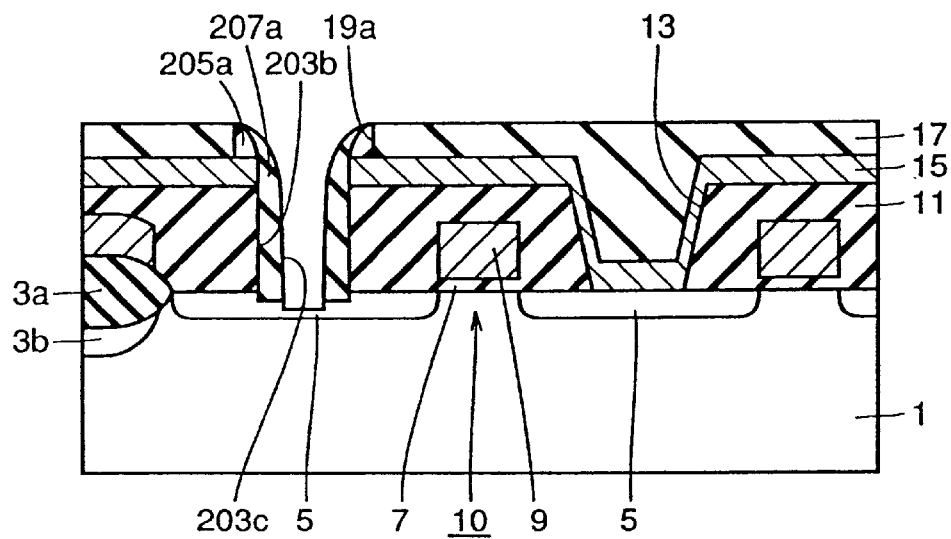
Figure 41:
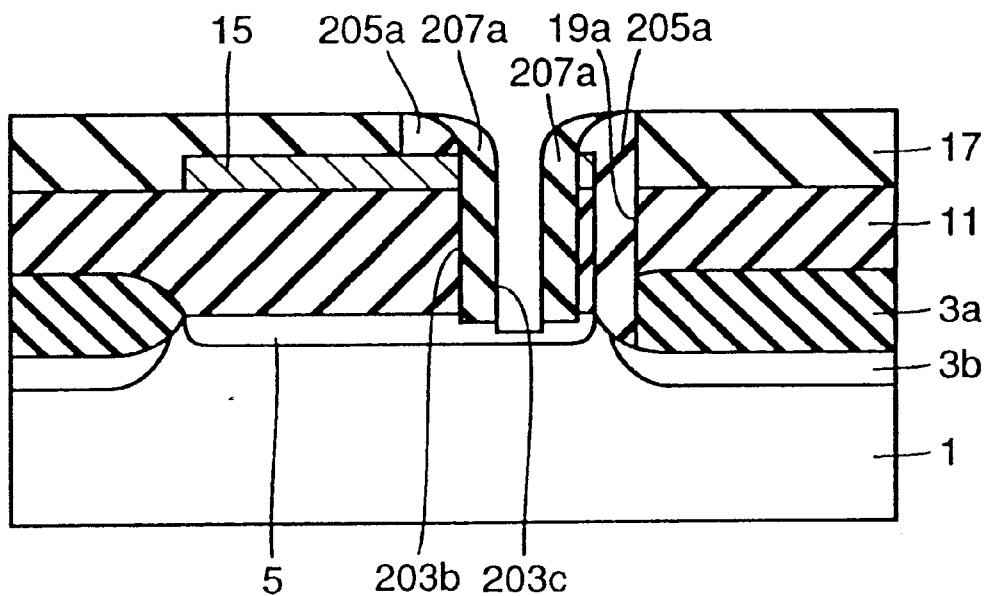
Figure 42:
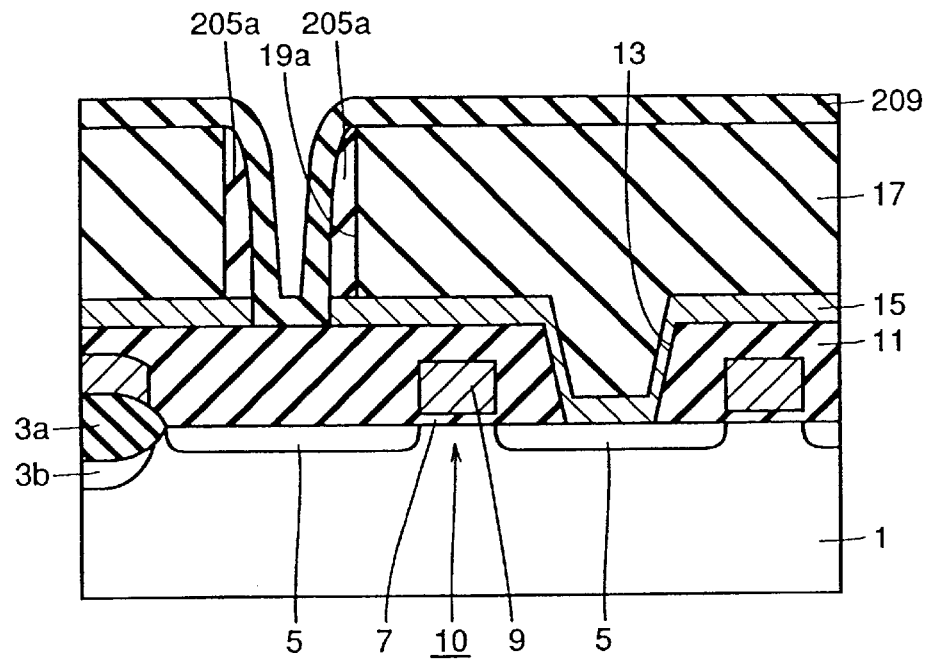
FIGS. 42 and 43 are schematic cross sectional views, taken along the line II—II of FIG. 1, illustrating the first and second steps of a method of manufacturing a semiconductor memory device according to a fifth embodiment of the present invention, respectively.

Referring to FIGS. 34 and 41, a upper surface of interlayer insulating layer 17 is exposed and a surface of p type silicon substrate 1 is exposed by the anisotropic etching. Furthermore, insulating layer 207 remains at a sidewall of opening 203b, thus forming a sidewall insulating layer 207a covering the exposed surface of bit line 15.

Thus, a contact hole 203c is formed.

In the manufacturing method according to the present embodiment, interlayer insulating layers 11, 17 and bit line 15 are not etched continuously, but only interlayer insulating layer 17 is etched, with resist pattern 41a used as a mask. Thus, insulating layer 17 on bit line 15 is not lost as described in the second and third embodiments.

Furthermore, in the manufacturing method according to the present embodiment, even if a surface of p type silicon substrate 1 is exposed at opening 19a due to mask misregistration in a photolithographic step, as shown in FIG. 35, the exposed surface of p type silicon substrate 1 is thereafter covered by sidewall insulating layer 205a in the process shown in FIGS. 36 and 37. Therefore, p type silicon substrate 1 will not be etched when bit line 15 is etched. Thus, short circuit between p type silicon substrate 1 and source/drain regions 5 by the storage node (i.e., problem (c)) can be prevented even if there is mask misregistration.

[Fifth Embodiment]

FIGS. 42 and 43 and FIGS. 44 and 45 are schematic cross sectional views illustrating, in order, the steps of a method of manufacturing a semiconductor memory device according to the fifth embodiment of the present invention, taken along the lines II—II and XXXV—XXXV of FIG. 1, respectively.

In the manufacturing method according to the present embodiment, similar steps as the fourth embodiment are performed up to the step shown in FIG. 31. Then, referring to FIGS. 42 and 44, an insulating layer 209 is formed on the entire surface. Insulating layer 209 is a silicon oxide film or a silicon nitride film formed, for example, by the CVD method to a film thickness of 1 $\mu$m. Furthermore, insulating layer 209 is preferably formed of a material the etching rate of which is almost the same as that of interlayer insulating layers 11, 17. Insulating layer 209 is anisotropically etched.

Figure 43:
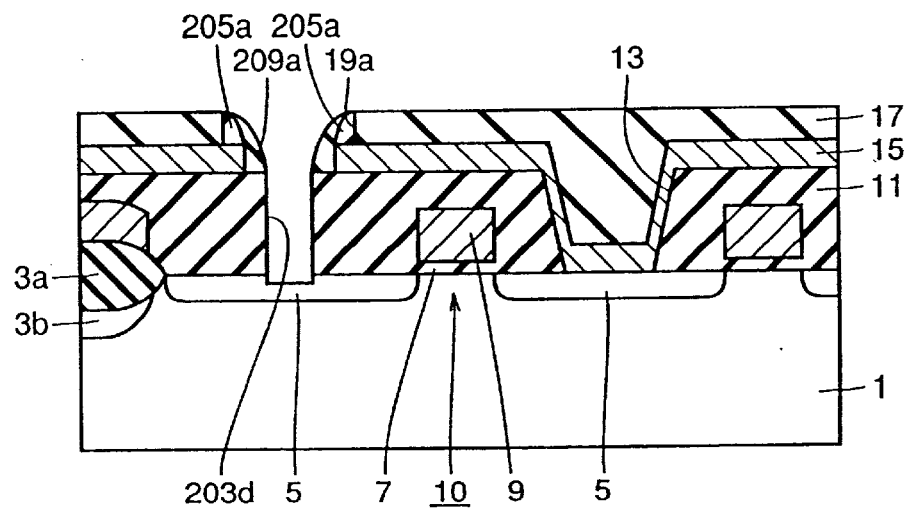
Figure 44:
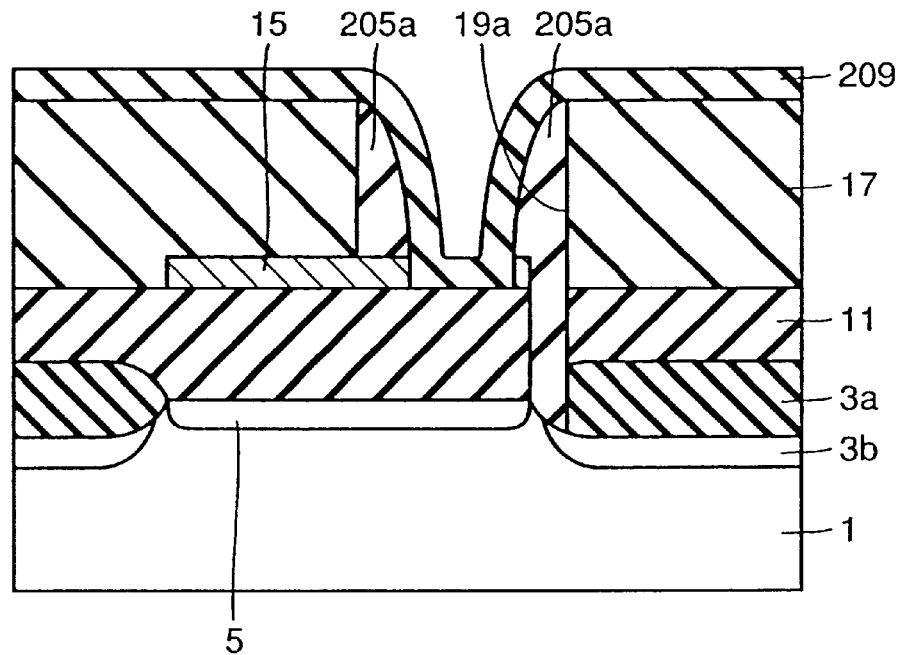
FIGS. 44 and 45 are schematic cross sectional views, taken along the line XXXV—XXXV of FIG. 1, illustrating the first and second steps of the method of manufacturing a semiconductor memory device according to the fifth embodiment of the present invention, respectively.
Figure 45:
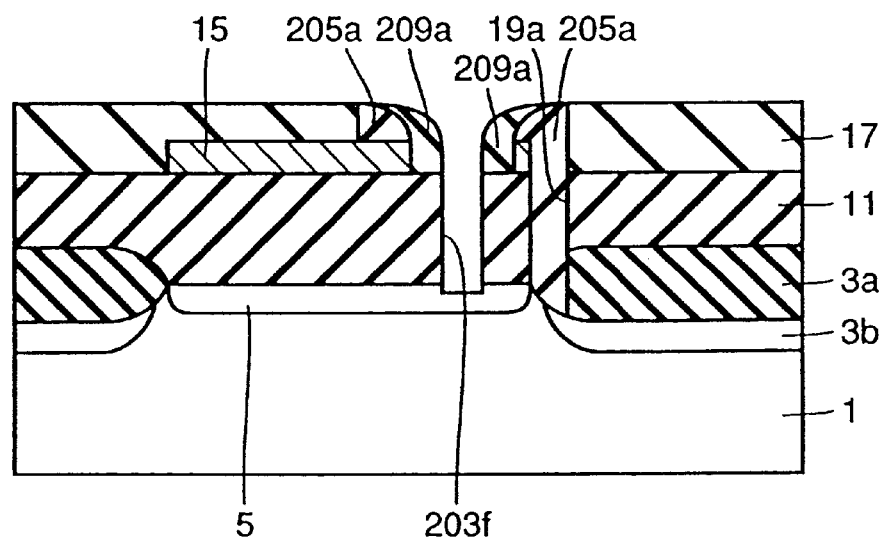
Figure 46:
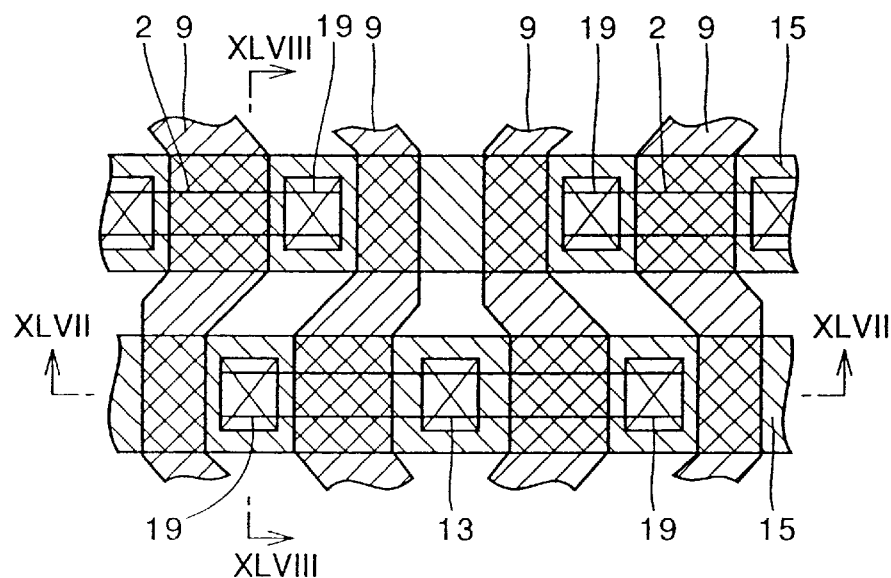
FIG. 46 is a schematic plan view of a structure of a conventional semiconductor memory device.
Figure 47:
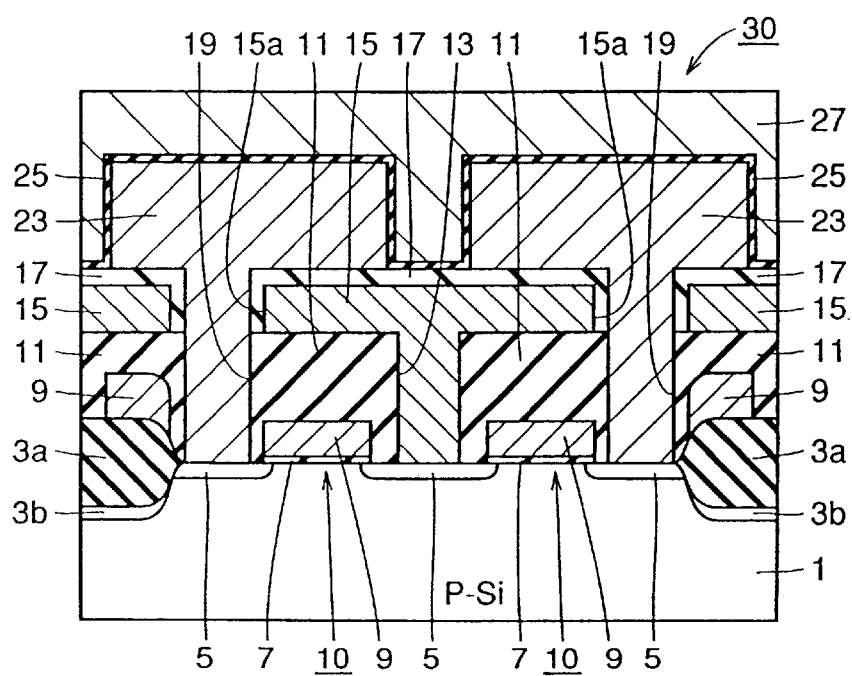
FIGS. 47 and 48 are schematic cross sectional views taken along the lines XLVII—XLVII and XLVIII—XLVIII of FIG. 46, respectively.
Figure 48:
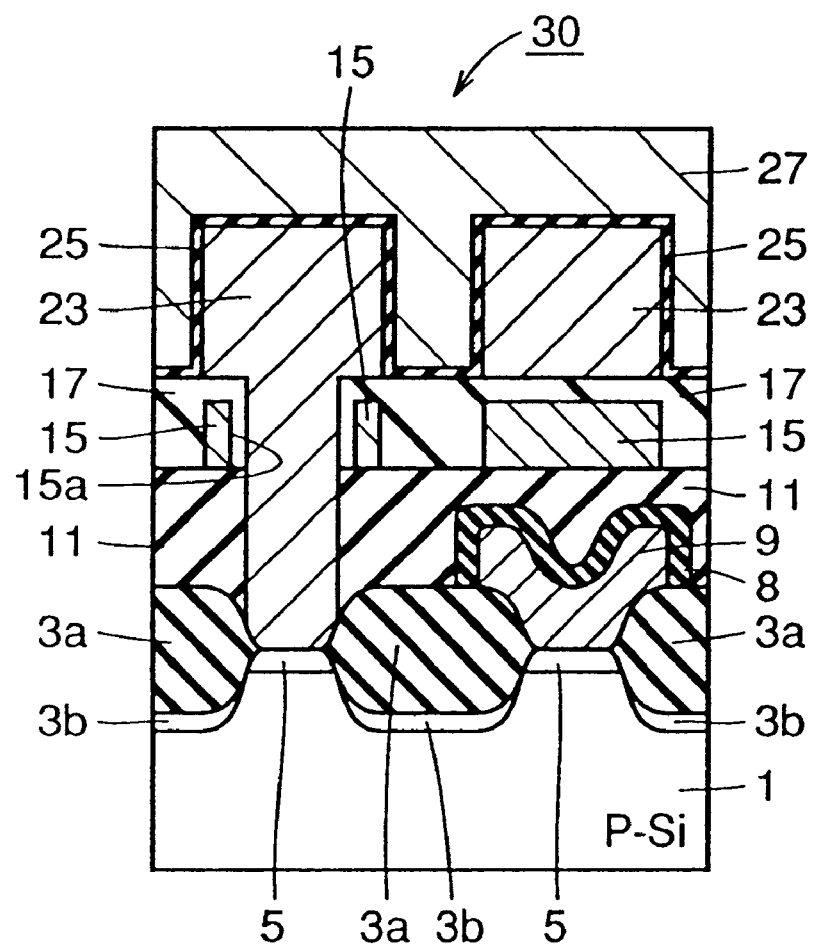
Figure 49:
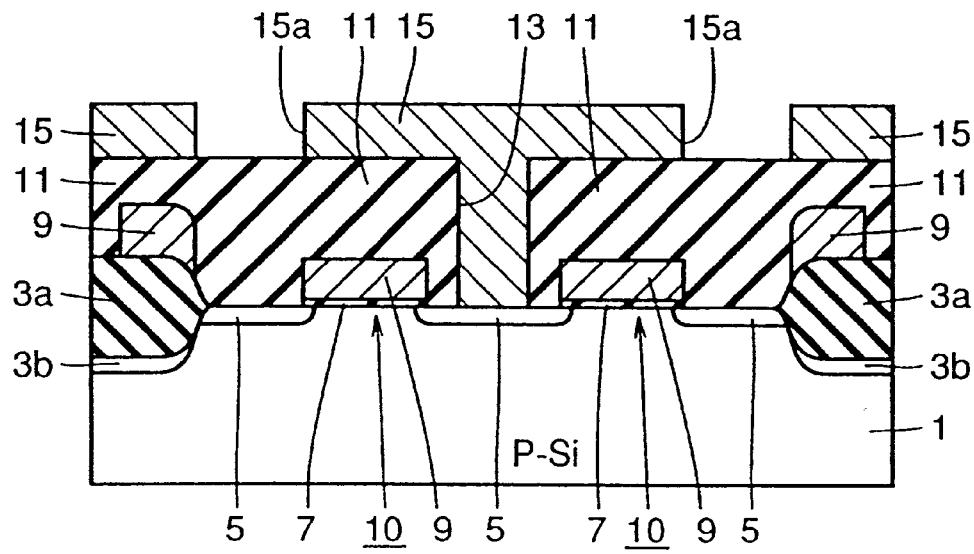
FIGS. 49–52 are schematic cross sectional views illustrating the first to fourth steps of a conventional method of manufacturing semiconductor devices, respectively.
Figure 50:
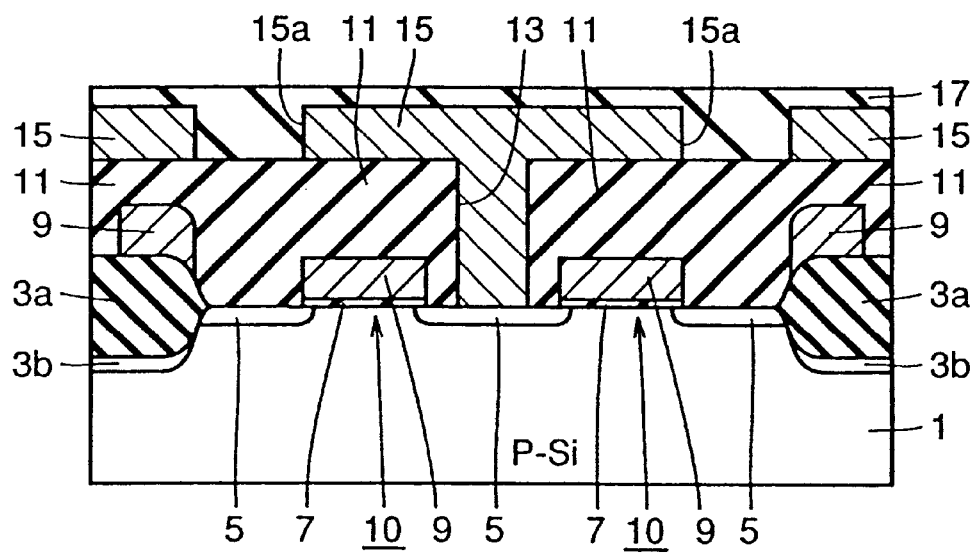

Referring to FIGS. 43 and 45, a sidewall insulating layer 209a remains due to anisotropic etching such that it covers the exposed surface of bit line 15. Furthermore, a surface of interlayer insulating layer 11 is exposed at sidewall insulating layer 209a. Then, the exposed surface of interlayer insulating layer 11 is anisotropically etched and a surface of source/drain regions 5 is exposed, thus forming a contact hole 203d.

In the manufacturing method according to the present embodiment, as described in the second to fourth embodiments, interlayer insulating layers 11, 17 and bit line 15 are not etched continuously, but only interlayer insulating layer 17 is etched, with resist pattern 41a used as a mask. Thus, the insulating layer on bit line 15 is not removed by this etching.

Furthermore, in the manufacturing method according to the present embodiment, even if a surface of p type silicon substrate 1 is exposed due to mask misregistration when forming opening 19a, as shown in FIG. 35, the exposed surface of p type silicon substrate 1 can be covered in the process shown in FIGS. 36 and 37. Thus, short-circuit between p type silicon substrate 1 and the source/drain regions by the storage node can be prevented as is in the fourth embodiment.

Although the present invention has been described and illustrated in detail, it is clearly understood that the same is by way of illustration and example only and is not to be taken by way of limitation, the spirit and scope of the present invention being limited only by the terms of the appended claims.

In a semiconductor memory device according to the present invention, a second hole for a storage node contact is provided such that it penetrates a conductive layer for a bit line. Thus, the storage contact need not be arranged avoiding the storage contact. This restrains increase in memory cell size due to the storage node avoiding the bit line.

Furthermore, a sidewall insulating layer is formed on a sidewall of the second hole penetrating the conductive layer for the bit line. Thus, short-circuit between the storage node and the bit line is prevented by the sidewall insulating layer when the storage node is formed within the second hole.

In a method of manufacturing a semiconductor memory device according to one aspect of the present invention, a through hole for a storage node to pass through is formed at a conductive layer for a bit line simultaneously with the formation of a second hole serving as a storage node contact. Although this causes the conductive layer for the bit line to be exposed at a sidewall of the second hole, the exposed portion is covered by a sidewall insulating layer. Thus, short-circuit between the conductive layer for the bit line and the storage node is prevented.

Furthermore, a through hole for a storage node to pass through is formed at a conductive layer for a bit line simultaneously with the formation of a second hole serving as a storage node contact. Thus, the film thickness of a sidewall insulating layer which covers the conductive layer for the bit line will not be extremely reduced locally even if there is mask misregistration at a resist pattern in forming the second hole. Therefore, decrease in the breakdown voltage between the storage node and the bit line as well as short-circuit between the storage node and the bit line, due to extremely reduced thickness of the sidewall insulating layer, are prevented.

Furthermore, a through hole for a storage node to pass through is formed at a conductive layer for a bit line simultaneously with the formation of a second hole serving as a storage node contact. Therefore, even if there is mask misregistration at a resist pattern when forming the second hole, increase in contact resistance due to reduced area of the contact portion of the storage node with the source/drain regions and due to scraping off of the contact portion by etching, is prevented.

Preferably in the above aspect, since the sidewall insulating layer is formed by self-alignment, increase in memory cell size is further restrained.

In the methods of manufacturing a semiconductor memory device according to the other three aspects of the present invention, not a hole penetrating a conductive layer for a bit line to reach source/drain regions is formed by continuously etching layers, but an insulating layer is formed when the hole is halfway formed. Thus, the insulating layer on the conductive layer for the bit line is not lost when the hole reaching the source/drain regions is formed. Therefore, short-circuit between a storage node formed above the conductive layer for the bit line and the conductive layer for the bit line is prevented.

Furthermore, even if a contact hole is displaced from a predetermined position due to mask misregistration in photolithography, short-circuit between a storage node and a semiconductor substrate is prevented.

Furthermore, crystal defect produced in source/drain regions directly under a contact hole is restrained. Therefore, increase in leakage current resulting from the crystal defect can be prevented.

What is claimed is:

1. A method of manufacturing a semiconductor memory device, comprising the steps of:

forming a gate electrode layer on a main surface of semiconductor substrate with a gate insulating layer posed therebetween;

forming a pair of source/drain regions at the main surface of said semiconductor substrate and sandwiching that region of said semiconductor substrate which is positioned under said gate electrode layer;

forming a first insulating layer on the main surface of said semiconductor substrate to cover said gate electrode layer;

forming in said first insulating layer a first hole reaching one of said paired source/drain regions;

forming a conductive layer for a bit line, electrically connected to one of said paired source/drain regions through said first hole and extending on said first insulating layer;

forming above said first insulating layer a second insulating layer covering said conductive layer for the bit line;

forming a second hole penetrating said conductive layer for the bit line to reach the other of said paired source/drain regions by forming on said second insulating layer a resist pattern having a predetermined pattern and etching said second insulating layer, said conductive layer for the bit line and said first insulating layer using said resist pattern as a mask;

forming a sidewall insulating layer covering a sidewall of said second hole; and forming a conductive layer for a storage node of a capacitor electrically connected to the other of said paired source/drain regions through said second hole.

2. The method of manufacturing a semiconductor memory device according to claim 1, wherein said step of forming said sidewall insulating layer includes the steps of:

forming a third insulating layer covering an internal wall of said second hole and said second insulating layer; and anisotropically etching said third insulating layer until the main surface of said semiconductor substrate is exposed at a bottom wall of said second hole.

3. The method of manufacturing a semiconductor memory device according to claim 1, further comprising the steps of:

forming a capacitor insulating layer covering said conductive layer for the storage node; and forming a conductive layer for a cell plate of said capacitor opposed to said conductive layer for the storage node with said capacitor insulating layer posed therebetween.

4. A method of manufacturing a semiconductor memory device, comprising the steps of:

forming a gate electrode layer on a main surface of semiconductor substrate with a gate insulating layer posed therebetween;

forming at the main surface of said semiconductor substrate a pair of source/drain regions sandwiching that region of said semiconductor substrate which is positioned under said gate electrode layer;

forming a first insulating layer on the main surface of said semiconductor substrate to cover said gate electrode layer;

forming in said first insulating layer a first hole reaching one of said paired source/drain regions;

forming a conductive layer for a bit line, electrically connecting with one of said paired source/drain regions through said first hole and extending on said first insulating layer;

forming above said first insulating layer a second insulating layer covering said conductive layer for the bit line;

forming at a region directly above the other of said paired source/drain regions a second hole penetrating said second insulating layer and said conductive layer for the bit lines to expose a surface of said first insulating layer;

forming a third insulating layer covering a surface of an internal wall of said second hole and a surface of said second insulating layer;

etching said third insulating layer until said first insulating layer is exposed at a bottom surface of said second hole and further etching said first insulating layer exposed at the bottom surface of said second hole to form a sidewall insulating layer of said third insulating layer covering an exposed surface of the conductive layer for the bit line, thus forming a contact hole reaching the other of said paired source/drain regions; and forming a conductive layer for a storage node of a capacitor electrically connecting with the other of said paired source/drain regions via said contact hole.

5. A method of manufacturing a semiconductor memory device, comprising the steps of:

forming a gate electrode layer on a main surface of semiconductor substrate with a gate insulating layer posed therebetween;

forming at the main surface of said semiconductor substrate a pair of source/drain regions sandwiching that region of said semiconductor substrate which is positioned under said gate electrode layer;

forming a first insulating layer on the main surface of said semiconductor substrate to cover said gate electrode layer;

forming in said first insulating layer a first hole reaching one of said paired source/drain regions;

forming a conductive layer for a bit line, electrically connecting with one of said paired source/drain regions through said first hole and extending on said first insulating layer;

forming above said first insulating layer a second insulating layer covering said conductive layer for the bit line;

forming at a region directly above the other of said paired source/drain regions a second hole penetrating said second insulating layer to reach a surface of said conductive layer for the bit line;

forming a third insulating layer covering a surface of an internal wall of said second hole and a surface of said second insulating layer;

etching said third insulating layer at a bottom surface of said second hole until a surface of said conductive layer for the bit line is exposed and leaving a first sidewall insulating layer formed of said third insulating layer at a sidewall of said second hole;

etching said conductive layer for the bit line exposed at a bottom surface of said second hole until a surface of said first insulating layer is exposed;

etching said first insulating layer exposed at a bottom surface of said second hole to form a hole reaching a surface of the other of said paired source/drain regions;

forming a fourth insulating layer covering a surface of an internal wall of said hole reaching the surface of the other of said source/drain regions and a surface of said second insulating layer;

etching said fourth insulating layer until a surface of the other of said paired source/drain regions is exposed to form a second sidewall insulating layer of said fourth insulating layer covering the exposed surface of said conductive layer for the bit line, thus forming a contact hole reaching the surface of the other of said paired source/drain regions; and forming a conductive layer for a storage node of a capacitor electrically connecting with the other of said paired source/drain regions via said contact hole.

6. A method of manufacturing a semiconductor memory device, comprising the steps of:

forming a gate electrode layer on a main surface of semiconductor substrate with a gate insulating layer posed therebetween;

forming at the main surface of said semiconductor substrate a pair of source/drain regions sandwiching that region of said semiconductor substrate which is positioned under said gate electrode layer;

forming a first insulating layer on the main surface of said semiconductor substrate to cover said gate electrode layer;

forming in said first insulating layer a first hole reaching one of said paired source/drain regions;

forming a conductive layer for a bit line, electrically connecting with one of said paired source/drain regions through said first hole and extending on said first insulating layer;

forming above said first insulating layer a second insulating layer covering said conductive layer for the bit line;

forming at a region directly above the other of said paired source/drain regions a second hole penetrating said second insulating layer to reach a surface of said conductive layer for the bit line;

forming a third insulating layer covering a surface of an internal wall of said second hole and a surface of said second insulating layer;

etching said third insulating layer at a bottom surface of said second hole until a surface of said conductive layer for the bit line is exposed and leaving a first sidewall insulating layer formed of said third insulating layer at a sidewall of said second hole;

etching said conductive layer for the bit line exposed at a bottom surface of said second hole until a surface of said first insulating layer is exposed;

forming a fourth insulating layer covering the exposed surface of said first insulating layer, an exposed surface of said conductive layer for the bit line, and a surface of said second insulating layer;

anisotropically etching said fourth insulating layer until said first insulating layer is exposed and further anisotropically etching the exposed surface of said first insulating layer until the other of said paired source/drain regions is reached to form a second sidewall insulating layer of said fourth insulating layer covering an exposed surface of said conductive layer for the bit line, thus forming a contact hole reaching the other of said paired source/drain regions; and forming a conductive layer for a storage node of a capacitor electrically connecting with the other of said paired source/drain regions via said contact hole.

* * * * *